(12) United States Patent
Noguchi

(10) Patent No.: US 6,500,875 B2
(45) Date of Patent: Dec. 31, 2002

(54) INK, INK-JET RECORDING METHOD USING THE SAME, AND PHOTOPOLYMERIZATION INITIATOR

(75) Inventor: Hiromichi Noguchi, Hachiohji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/978,104

(22) Filed: Oct. 17, 2001

(65) Prior Publication Data

US 2002/0064603 A1 May 30, 2002

Related U.S. Application Data

(62) Division of application No. 09/294,333, filed on Apr. 20, 1999.

(30) Foreign Application Priority Data

| Apr. 28, 1998 | (JP) | 10-119358 |
| Oct. 16, 1998 | (JP) | 10-295452 |
| Apr. 9, 1999 | (JP) | 11-103352 |

(51) Int. Cl.$^7$ ............... C08F 2/50; C08F 4/00; G03C 1/73; C07C 49/82
(52) U.S. Cl. ............. 522/42; 522/44; 522/84; 522/75; 568/337
(58) Field of Search ............. 522/42, 44, 75, 522/84; 568/335, 336, 337

(56) References Cited

U.S. PATENT DOCUMENTS

| 4,861,916 A | 8/1989 | Köhler et al. |
| 4,978,969 A | 12/1990 | Chieng ........ 346/1.1 |
| 5,045,573 A | 9/1991 | Köhler et al. ........ 522/42 |
| 5,532,112 A | * 7/1996 | Kohler et al. |
| 5,554,739 A | 9/1996 | Belmont ........ 534/885 |
| 5,623,001 A | 4/1997 | Figov |
| 5,681,643 A | 10/1997 | Noguchi et al. |
| 5,952,401 A | 9/1999 | Kimura et al. |
| 5,985,015 A | 11/1999 | Kanaya |

FOREIGN PATENT DOCUMENTS

| EP | 0337705 | 10/1989 |
| EP | 0562862 | 9/1993 |
| GB | 2256874 | 12/1992 |
| GB | 2314851 | 1/1998 |
| JP | 5-64667 B2 | 3/1987 |
| JP | 5-186725 | 7/1993 |
| JP | 7-224241 | 8/1995 |
| JP | 8-80665 | 3/1996 |
| WO | WO 86/05778 | 10/1986 |

OTHER PUBLICATIONS

J.E. Johnson, "Surface Modification of Black Pigments: A Novel Approach for Advancing Black Pigment Performance In Imaging Systems", IS & T's 50$^{th}$ Annual Conference, Cambridge, Mass., May 18–23, 1997.

M. Köhler, "A Versatile α–hydroxyketone Photoinitiator", European Coatings Journal 12/97, pp. 1118–1120.

Patent Abstracts of Japan, vol. 017, No. 617, (C–1129) with respect to JP 5–186725 of Jul. 27, 1993 (Nov. 15, 1993).

* cited by examiner

Primary Examiner—Susan W. Berman
(74) Attorney, Agent, or Firm—Fitzpatrick, Cella, Harper & Scinto

(57) ABSTRACT

An ink for ink-jet recording contains a coloring agent, a polymerizable oligomer, water, and a photopolymerization initiator having a solubility in water of 3 percent by weight or more. Another ink for ink-jet recording contains a coloring agent, a polymerizable oligomer having at least two acryloyl groups and a solubility in water of 10 percent by weight or more, a photopolymerization initiator, and water. The specified polymerizable oligomer or photopolymerization initiator reduces bleeding of the ink on recording media.

4 Claims, 8 Drawing Sheets

INK, INK-JET RECORDING METHOD USING THE SAME, AND PHOTOPOLYMERIZATION INITIATOR

This is a divisional application of application Ser. No. 09/294,333, filed Apr. 20, 1999.

BACKGROUND OF THE INVENTION

1. Field of the Invention

The present invention relates to a UV-curable ink preferably used in ink-jet recording, an ink-jet recording method improving image quality, and a novel photopolymerization initiator having high solubility in water.

2. Description of the Related Art

Examples of aqueous ink-jet inks in use include an aqueous black dye ink containing a water-soluble black dye dissolved in an aqueous medium, and an aqueous black pigment ink containing a black pigment such, as carbon black, in an aqueous medium.

Recording using an aqueous black dye ink facilitates a shortened initial fixing time, yields a satisfactory image density, and causes little or no bleeding between this ink and color inks. The recorded image, however, does not generally have sufficient water resistance, smear resistance, and light durability. When the recorded image is covered with a marker pen (high-lighter), the recorded characters may blur. In particular, in documents including black characters and color images, mutual bleeding may occur between a black character and the adjacent color images and results in a lack of crispness of the characters. Such a problem requires appropriate solutions, for example, a reduced printing rate.

An aqueous black pigment ink tends to require a prolonged initial time for fixing the pigment to a recording medium, which inhibits improvement in printing rate. Furthermore, increased printing density causes decreased smear or scuff resistance; hence, ink transferred by scuff marks may cause contamination, or tracing of the printed section with a color marker pen may lessen the crispness of the printed characters. Aqueous black pigment inks in practical use readily cause bleeding with color inks; hence, the use of such inks may be restricted in documents containing characters and color images in some cases.

Various means have been disclosed for solving such technical problems. Examples of improvement in smear resistance of aqueous pigment inks include addition of water-soluble resins as binding resins in inks, addition of curable resins, and addition of microemulsion particles. A means for reducing the fixing time includes use of a solvent which accelerates the penetration of the ink into the recording medium, the solvent being capable of suppressing bleeding between black and color sites and suppressing the decrease in optical density of the characters. A method for avoiding color bleeding includes use of a black ink containing a cationic polymer and carbon black which suppresses mutual diffusion with an anionic color ink.

Although these methods can effectively improve individually targeted problems, they are insufficient overall improvement.

Furthermore, one of the typical means for improving the smear resistance of a printed image using aqueous inks includes use of a UV-curable ink. UV-curable inks have been used for marking in industrial apparatuses in known ink-jet recording technologies. These inks are nonaqueous inks using ketone solvents. UV-curable inks are also disclosed in Japanese Patent Publication No. 5-64667, Japanese Patent Application Laid-Open Nos. 5-186725, and 7-224241, and U.S. Pat. No. 4,978,969.

An ink disclosed in Japanese Patent Publication No. 5-64667 contains a pigment and a polymerizable polyacrylate having a functionality of three or more as essential components, and a ketone and an alcohol as primary solvents. An ink disclosed in Japanese Patent Application Laid-Open No. 5-186725 contains water and a photocurable prepolymer and is used in ink-jet printers. An ink disclosed in Japanese Patent Application Laid-Open No. 7-224241 is an aqueous UV-curable pigment ink used in bubble jet processes. This ink contains a pigment, an aqueous polymeric compound for dispersing the pigment in an aqueous medium, a water-soluble monomer, an aqueous medium, and a polymerization initiator, and has a viscosity of 10 cps or less. U.S. Pat. No. 4,978,969 discloses a method for forming an image by discharging an ink containing a UV-curable adhesive by a thermal ink-jet process.

SUMMARY OF THE INVENTION

The present inventors have further studied conventional photo-curable inks for ink-jet recording, taking into consideration that an ink-jet recording process using a photo-curable ink is a method that possibly can improve the above-mentioned problems totally. Conventional photo-curable inks generally contain polymerizable oligomers and photopolymerization initiators which are not at all soluble or are slightly soluble in aqueous media, and contain various water-soluble organic solvents to stabilize discharge in ink-jet recording. However, such organic solvents may affect the penetrability of the inks into recording media, and thus affect image quality. The present inventors have concluded that such organic solvents are one of the reasons why conventional photo-curable inks are not sufficient to improve the aforementioned problems totally.

Accordingly, it is an object of the present invention to provide a photo-curable ink which does not substantially affect ink-jet recording performance even when a polymerizable oligomer and a photo-initiator are contained in the ink as essential components.

It is another object of the present invention to provide an ink-jet recording method which facilitates formation of a high-quality image using a photo-curable ink.

It is still another object of the present invention to provide an ink-jet recording method which facilitates formation of a multicolor image using a photo-curable ink.

According to a first aspect of the present invention, there is provided an ink for ink-jet recording comprising a coloring agent, a polymerizable oligomer, a photopolymerization initiator and water, the photopolymerization initiator having a solubility in water of 3 percent by weight or more.

According to a further aspect of the present invention, there is provided an ink for ink-jet recording comprising a coloring agent, a polymerizable oligomer, a photopolymerization initiator and water, the polymerizable oligomer having at least two acryloyl groups and a solubility in water of 10 percent by weight or more.

According to a further aspect of the present invention, there is provided a method for forming an image on a recording medium comprising the steps of: (a) imparting an ink comprising a coloring agent, a polymerizable oligomer, a photopolymerization initiator having a solubility in water of 3 percent by weight or more, and water, on the surface of the recording medium; and (b) irradiating the ink on the recording medium with light.

According to a further aspect of the present invention, there is provided a method for forming an image on a recording medium comprising the steps of: (a) imparting an ink for ink-jet recording on the recording medium, the ink comprising a coloring agent, a polymerizable oligomer having at least two acryloyl groups and a solubility in water of 10 percent by weight or more, a photopolymerization initiator, and water, and (b) irradiating the ink on the recording medium with light.

In these aspects, the oligomer and the photopolymerization initiator in each photo-curable ink have high solubility in water; hence, addition of an organic solvent, which adversely affects the image quality, for dissolving these components in the ink is not substantially required. As a result, a high-quality image is obtainable.

According to a further aspect of the present invention, there is provided a photopolymerization initiator represented by the following general formula (1):

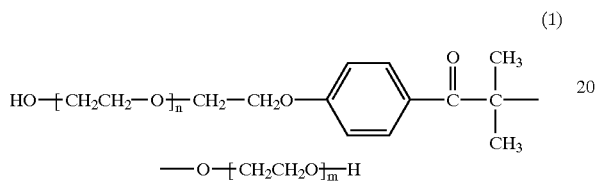

(1)

wherein n is an integer of 1 or more, m is an integer of 0 or more, the sum of n and m is in a range of 1 to 8, and n is in a range of 1 to 8 when m is zero.

Since the photopolymerization initiator effectively forms radicals by ultraviolet light and has high solubility in water compared to conventional nonionic photopolymerization initiators, it can be preferably used for aqueous photo-curable ink-jet inks and aqueous photo-curable paints.

According to a still further aspect of the present invention, there is provided a method for recording a multicolor image including a black image by imparting a black ink and at least one color ink selected from a yellow ink, a magenta ink, and a cyan ink to a recording medium by an ink-jet process, comprising the steps of:

(a) imparting a black ink having any one of the following Compositions (i) to (iv) to the recording medium by an ink-jet process:

Composition (i):
at least one coloring agent selected from the group consisting of a combination of a black pigment and a water-soluble soluble cationic polymeric compound for dispersing the black pigment in water, a cationic black dye, and a cationic self-dispersing carbon black, a nonionic or cationic polymerizable oligomer, a nonionic or cationic photopolymerization initiator having a solubility in water of 3 percent by weight or more, and water;

Composition (ii):
at least one coloring agent selected from the group consisting of a combination of a black pigment and a water-soluble cationic polymeric compound for dispersing the black pigment in water, a cationic black dye, and a cationic self-dispersing carbon black, a nonionic or cationic polymerizable oligomer having at least two acryloyl groups and having a solubility in water of 10 percent by weight or more, a nonionic or cationic photopolymerization initiator, and water;

Composition (iii):
at least one coloring agent selected from the group consisting of a combination of a black pigment and a water-soluble anionic polymeric compound for dispersing the black pigment in water, an anionic black dye, and an anionic self-dispersing carbon black, a nonionic polymerizable oligomer, a nonionic photopolymerization initiator having a solubility in water of 3 percent by weight or more, and water;

Composition (iv):
at least one coloring agent selected from the group consisting of a combination of a black pigment and a water-soluble anionic polymeric compound for dispersing the black pigment in water, an anionic black dye, and an anionic self-dispersing carbon black, a nonionic polymerizable oligomer having at least two acryloyl groups and having a solubility in water of 10 percent by weight or more, a nonionic photopolymerization initiator, and water;

(b) imparting a color ink having any one of the following Compositions (v) to (viii) to the recording medium by an ink-jet process:

Composition (v):
at least one coloring agent selected from the group consisting of a combination of a color pigment and a water-soluble cationic polymeric compound for dispersing the color pigment in water, and a cationic color dye, a nonionic or cationic polymerizable oligomer, a nonionic or cationic photopolymerization initiator having a solubility in water of 3 percent by weight or more, and water;

Composition (vi):
at least one coloring agent selected from the group consisting of a combination of a color pigment and a water-soluble cationic polymeric compound for dispersing the color pigment in water, and a cationic color dye, a nonionic or cationic polymerizable oligomer having at least two acryloyl groups and having a solubility in water of 10 percent by weight or more, a nonionic or cationic photopolymerization initiator, and water;

Composition (vii):
at least one coloring agent selected from the group consisting of a combination of a dolor pigment and a water-soluble anionic polymeric compound for dispersing the color pigment in water, and an anionic color dye, a nonionic polymerizable oligomer, a nonionic photopolymerization initiator having a solubility in water of 3 percent by weight or more, and water;

Composition (viii):
at least one coloring agent selected from the group consisting of a combination of a color pigment and a water-soluble anionic polymeric compound for dispersing the color pigment in water, and an anionic color dye, a nonionic polymerizable oligomer having at least two acryloyl groups and having a solubility in water of 10 percent by weight or more, a nonionic photopolymerization initiator, and water; and (c) irradiating the black ink and the color ink imparted to the recording medium with light for photo-crosslinking of the inks, wherein the black ink and the color ink are selected so that the polarity of the coloring agent and the water soluble polymeric compound of the black ink are opposite to the polarity of the coloring agent and the water soluble polymeric compound of the color ink.

The method according to this aspect can effectively suppress bleeding between adjacent different color inks on the recording medium before photo-crosslinking, resulting in formation of a high-quality image.

Further objects, features and advantages of the present invention will become apparent from the following description of the preferred embodiments with reference to the attached drawings.

DETAILED DESCRIPTION OF THE PREFERRED EMBODIMENTS

Figure 1:
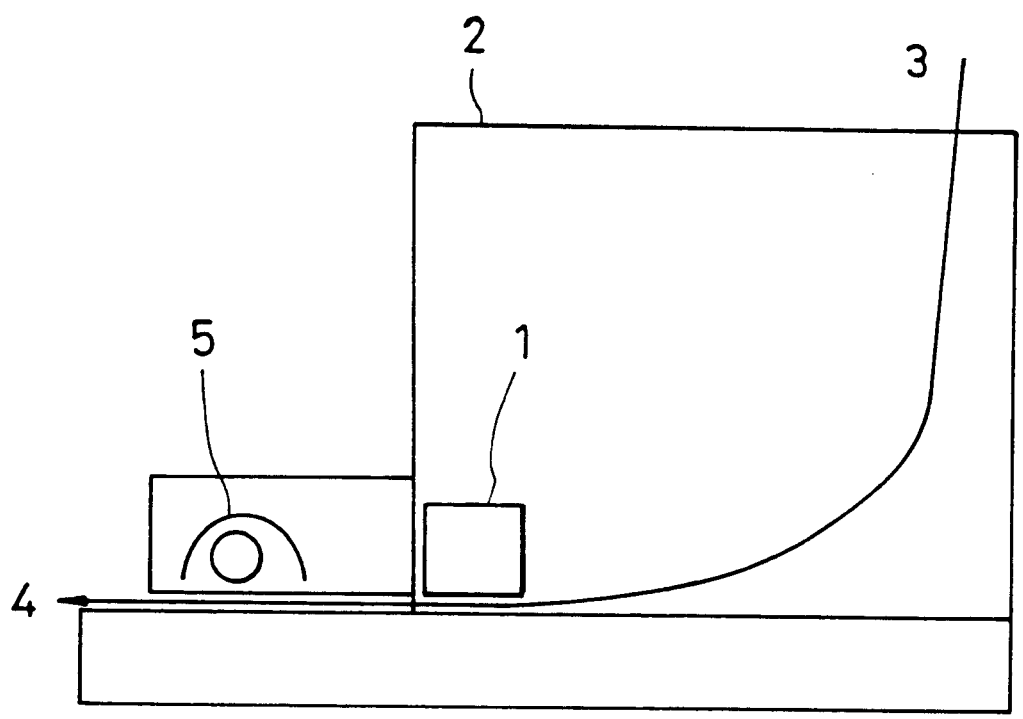
FIG. 1 is a schematic view of a configuration of an ink-jet printer usable in the present invention.

An ink for ink-jet recording according to an embodiment of the present invention is a photo-curable ink and comprises a coloring agent, a polymerizable oligomer, a photopolymerization initiator having a solubility in water of 3 percent by weight or more, and water.

Ink Ingredients

A. Coloring Agent

Various coloring agents can be used in such an ink for ink-jet recording. Examples of coloring agents include pigments, anionic dyes, and cationic dyes. Examples of pigments include self-dispersing pigments having surface cationic or anionic groups. Pigments that are not dissolved in aqueous media but are stably dispersed in aqueous media by the effects of water-soluble cationic polymeric compounds or water-soluble anionic polymeric compounds, can also be used as the coloring agents of the present invention in combination with the water-soluble polymeric compounds. By selecting the coloring agent, either a black ink or a color ink is prepared in the present invention.

A1. Black Ink

Coloring agents for black ink will now be described.

A1-1. Black Pigment

Carbon Black as Black Pigment (a) Cationic Self-Dispersing Black Pigment

A cationic self-dispersing black pigment may be a black pigment having cationic groups or may be a dispersion of a black pigment in a water-soluble polymer having cationic groups. In the latter case, the cationic water-soluble polymer functions as a dispersant for the black pigment particles and reacts with an anionic dye or dispersant in an aqueous color ink. Such reaction can suppress color bleeding in multicolor printing caused by mutual diffusion between adjacent dots.

In the cationic self-dispersing black pigment having cationic groups, the cationic groups are covalently bonded to the surface of the self-dispersing black pigment so that the pigment can disperse in an ink without dispersion treatment. Examples of cationic groups include an ammonium cation, a quaternary ammonium salt of a tertiary amine, a pyridinium cation, and a sulfonium cation. The cationic groups on the pigment surface may consist of the same type or different types. The cationic self-dispersing black pigment imparts desired characteristics to an aqueous black ink in an acidic or neutral pH region.

Preferable cationic self-dispersing carbon black is prepared by a method disclosed in, for example, "The 50th Imaging Science & Technologies" by J. E. Johnson (Cabot Co.), p. 310, and U.S. Pat. No. 5,554,739 (Cabot Co.). The cationic carbon black is a surface-modified pigment having cationic groups, such as a quaternary ammonium $[R_4N]^+$ group, a quaternary phosphonium $[R_4P]^+$ group, an N-methylpyridinium group, and an N-phenylpyridinium group. A carbon black pigment having a hydrochloric acid salt of a tertiary amine can also be used in the present invention. Such a carbon black pigment is prepared by the same method, that is, unsaturated double bonds on the pigment are allowed to react with a compound which has a tertiary amino group at one end and an aromatic diazonium salt at the other end so that atomic groups having tertiary nitrogen atoms are bonded to the pigment surface, and the salt is neutralized with hydrochloric acid. Another method for preparing a cationic carbon black pigment is bonding of a lower polymer or oligomer by graft polymerization of an acrylic monomer having a cationic side chain onto the surface of the black pigment. The resulting cationic carbon black pigment may also be used in the present invention.

The average particle size or diameter of the black pigment, such as carbon black, having surface cationic groups is in the range of 70 nm to 250 nm. The black pigment having surface cationic groups can effectively suppress mutual diffusion between a cationic ink containing the black pigment and an anionic ink.

(b) Carbon Black+Water-soluble Cationic Polymeric Compound

Addition of a water-soluble cationic polymeric compound as a dispersant disclosed in Japanese Patent Application Laid-Open No. 8-80665 enables use of a general carbon black in an ink. That is, a dispersion of black pigment particles dispersed with a water-soluble cationic polymeric compound is also preferably used in the present invention. Examples of water-soluble cationic polymeric compounds include copolymers of the following monomers; N,N-dimethylaminoethyl methacrylate, N,N-dimethylaminoethyl acrylate, N,N-dimethylaminopropyl methacrylate, N,N-dimethylaminopropyl acrylate, N,N-dimethylacrylamide, N,N-dimethylmethacrylamide, N,N-dimethylaminoethylacrylamide, N,N-dimethylethylmethacrylamide, N,N-dimethylaminopropylacrylamide, and N,N-dimethylaminopropylmethacrylamide. The copolymer contains the monomer in an amount of 10 to 50 percent by weight. Examples of the comonomers in these copolymers include water-soluble monomers, such as acrylamide, acrylonitrile, and alkyl acrylates.

The average particle size or diameter of the black pigment, such as carbon black, dispersed with a water-soluble cationic polymeric compound is in the range of 70 nm to 250 nm. Examples of the cationic groups in the water-soluble cationic polymeric compound include an ammonium group and a quaternary ammonium salt of a tertiary amine. Examples of sources of counter ions to the cationic groups include acetic acid, lactic acid, hydrochloric acid, sulfuric acid, and succinic acid. The counter ions stabilize dissociation and thus enhance dispersibility in the aqueous medium.

The amount of the cationic groups imparted to the black pigment or water-soluble polymeric compound may be adequately determined as long as satisfactory dispersion in the ink and advantages of the present invention are achieved.

A black pigment in an amount of 0.5 to 10 parts by weight is added to 100 parts by weight of ink. The pH of the ink is in a range of 2.5 to 8.0. A combination of a pH in the above range and a particle size in the above range is preferable to further stabilize dispersion of the ink.

(c) Anionic Self-Dispersing Carbon Black

In a typical anionic self-dispersing carbon black, anionic groups are covalently bonded to the surface of carbon black. Examples of anionic groups include —COOM, —SO$_3$M, —PO$_3$HM, and —PO$_3$M$_2$, wherein M is a hydrogen atom, an alkaline metal, an ammonium ion, or an organic ammonium group.

Negatively charged carbon black having —COOM or —SO$_3$M groups directly or indirectly bonded to the surface imparts superior dispersibility to ink and is thus preferably used. Examples of the alkaline metals (M) include lithium, sodium and potassium. Examples of organic ammonium groups include monomethylammonium to trimethylammonium, and monomethanolammonium to triethanolammonium. A method for making the anionic self-dispersing carbon black is oxidation of carbon black with sodium hypochlorite. By this method,—COONa groups are bonded to the surface of the carbon black.

The above-mentioned hydrophilic groups may be directly bonded to the surface of carbon black. Alternatively, other atomic groups may intervene between the surface and the hydrophilic groups to introduce indirect bonding between the hydrophilic groups and the surface. Examples of the other atomic groups include linear or branched alkylene groups having 1 to 12 carbon atoms, substituted or unsubstituted phenylene groups, and substituted or unsubstituted naphthylene groups. Examples of the substituent groups in the substituted phenylene groups and the substituted naphthylene groups include linear or branched alkyl groups having 1 to 6 carbon atoms. Examples of combination of the other atomic groups with the hydrophilic groups include —C$_2$H$_4$—COOM, —Ph—SO$_3$M, and —Ph—COOM, wherein Ph is a phenylene group.

(d) Carbon Black+Water-soluble Anionic Polymeric Compound

In the black pigment of the present invention, a general carbon black may be used with a water-soluble anionic polymeric compound as a dispersant. Examples of water-soluble anionic polymeric compounds include polymers soluble in alkaline aqueous solution, e.g., styrene-acrylic acid copolymers, styrene-acrylic acid-alkyl acrylate copolymers, styrene-maleic acid copolymers, and styrene-maleic acid-acrylic acid copolymers.

A1-2. Black Dye

Black dyes are also used as black coloring agents. Since the ink in accordance with the present invention is cured by ultraviolet light on a recording medium, use of a dye having good light resistance is preferable. Examples of preferable black dyes include monoazo or bisazo complexes having multivalent metallic ligands, such as Cr, Cu, Mn, Al, Zn, and Fe, and noncomplex-type azo-black dyes, such as C.I. Direct Black 17, C.I. Direct Black 19, C.I. Direct Black 51, C.I. Direct Black 154, C.I. Direct Black 174, and C.I. Direct Black 195.

Black cationic dyes can also be used as coloring agents. Examples of the black cationic dyes include Aizen Cationic Black SBH, Aizen Cationic Black BXH, Aizen Cationic Black SH, Aizen Cationic Black ACH, Aizen Cationic Black MH, and Aizen Cationic Black TH made by Hodogaya Chemical Co., Ltd.; Sumiacryl Black B, Sumiacryl Black R, Sumiacryl Black AP, Sumiacryl Black BP, Sumiacryl Black CP, Sumiacryl Black PPP made by Sumitomo Chemical Co., Ltd.; and Diacryl Supra Black GSL, Diacryl Supra Black RSL, and Diacryl Supra Black ESL made by Mitsubishi Chemical Corporation.

A2. Color Ink

Color inks used in color recording will now be described.

A2-1. Aqueous Color Ink

An aqueous color ink used in the present invention may be an aqueous anionic dye dissolved in an aqueous medium or an anionic organic pigment dispersed in an aqueous dispersant. The aqueous color ink may be of an ultraviolet curable type, if necessary. Dyes or pigments which are stable against light such as ultraviolet light are preferably used as coloring agents in an ultraviolet-curable-type aqueous color ink. The dose of ultraviolet light for practical curing treatment is generally negligible with respect to discoloration of dyes and pigments that have typically been used. Such low energy irradiation permits use of known direct dyes, acidic dyes, reactive dyes, metal complexes thereof, and multivalent metal salts thereof.

A2-2. Color Pigment

Examples of organic pigments which are used in color inks and have hue as process color are as follows:

(A) Yellow pigments: Pigment Yellow 1, Pigment Yellow 2, Pigment Yellow 3, Pigment Yellow 12, Pigment Yellow 13, Pigment Yellow 14, Pigment Yellow 16, Pigment Yellow 17, Pigment Yellow 55, Pigment Yellow 73, Pigment Yellow 74, Pigment Yellow 75, Pigment Yellow 83, Pigment Yellow 93, Pigment Yellow 95, Pigment Yellow 97, Pigment Yellow 98, Pigment Yellow 109, Pigment Yellow 110, Pigment Yellow 114, Pigment Yellow 128, Pigment Yellow 138, Pigment Yellow 139, Pigment Yellow 150, Pigment Yellow 151, Pigment Yellow 154, and Pigment Yellow 180.

(B) Magenta pigments: Pigment Red 5, Pigment Red 7, Pigment Red 12, Pigment Red 48(Ca), Pigment Red 48(Mn), Pigment Red 57:1, Pigment Red 57(Sr), Pigment Red 57:2, Pigment Red 122, Pigment Red 123, Pigment Red 168, Pigment Red 184, and Pigment Red 202.

(C) Cyan pigments: Pigment Blue 1, Pigment Blue 2, Pigment Blue 3, Pigment Blue 16, Pigment Blue 22, Pigment Blue 60, Pigment Blue 15:2, Pigment Blue 15:3, Vat Blue 4, and Vat Blue 60.

A2-3. Anionic Color Dye

Although dyes are generally inferior to pigments in light resistance, dyes can be practically used by optimizing the wavelength and intensity of light for curing so that discoloration is reduced as much as possible. Dyes to be used are determined depending on the application. Examples of anionic color dyes are as follows.

(A) Yellow dyes: Acid Yellow 11, Acid Yellow 17, Acid Yellow 23, Acid Yellow 25, Acid Yellow 29, Acid Yellow 42, Acid Yellow 49, Acid Yellow 61, Acid Yellow 71, Direct Yellow 12, Direct Yellow 24, Direct Yellow 26, Direct Yellow 44, Direct Yellow 86, Direct Yellow 87, Direct Yellow 98, Direct Yellow 100, Direct Yellow 130, Direct Yellow 132, Direct Yellow 142, and dyes represented by the following formulae (34) and (35):

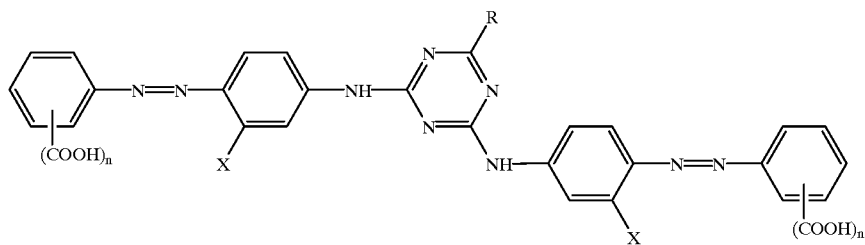

(34)

wherein R=H or CH₃, X=H, OH or CH₃, and n=1 or 2;

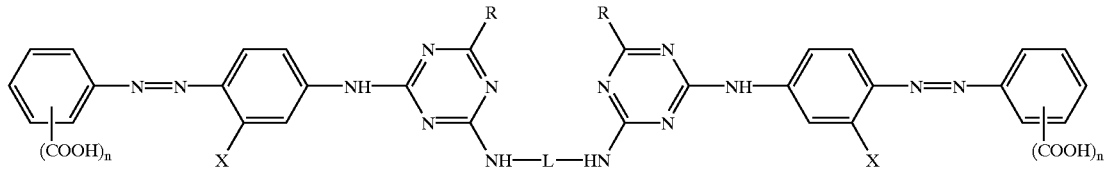

(35)

wherein R=H or CH₃, X=H, OH or CH₃, —L—=—CH₂CH₂—,

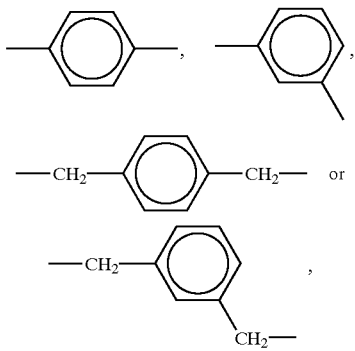

and n=1 or 2.

(B) Magenta dyes: Acid Red 1, Acid Red 6, Acid Red 8, Acid Red 32, Acid Red 35, Acid Red 37, Acid Red 51, Acid Red 52, Acid Red 80, Acid Red 85, Acid Red 87, Acid Red 92, Acid Red 94, Acid Red 115, Acid Red 180, Acid Red 254, Acid Red 256, Acid Red 289, Acid Red 315, Acid Red 317, Direct Red 1, Direct Red 4, Direct Red 13, Direct Red 17, Direct Red 23, Direct Red 28, Direct Red 31, Direct Red 62, Direct Red 79, Direct Red 81, Direct Red 83, Direct Red 89, Direct Red 227, Direct Red 240, Direct Red 242, Direct Red 243 and dyes represented by the following formulae (36) to (38):

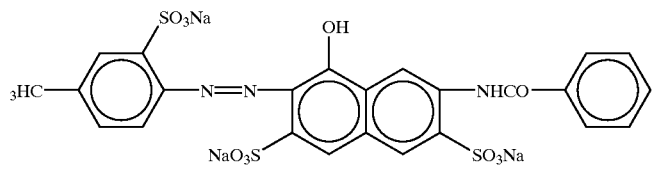

(36)

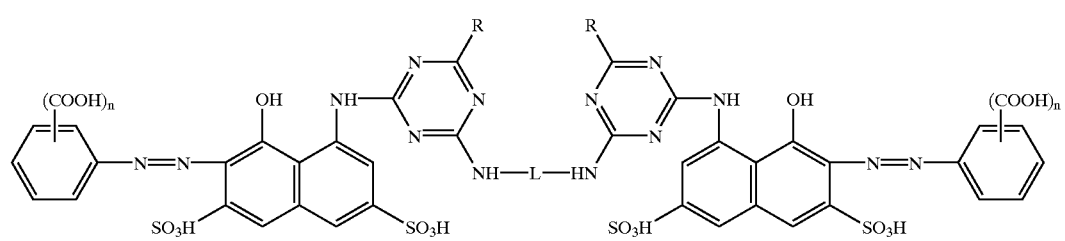

(37)

wherein R=H, OH or CH$_3$, —L—=—CH$_2$CH$_2$—,

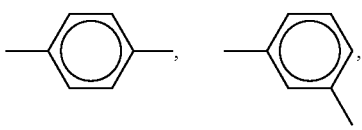

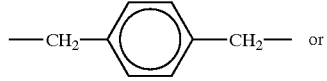

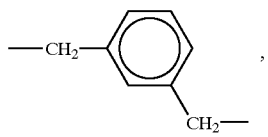

and n=1 or 2;

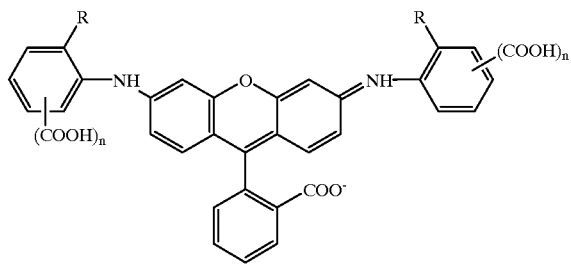

(38)

wherein R=OH or CH$_3$, and n=1 or 2.

(C) Cyan dyes: Acid Blue 9, Acid Blue 22, Acid Blue 40, Acid Blue 59, Acid Blue 93, Acid Blue 102, Acid Blue 104, Acid Blue 113, Acid Blue 117, Acid Blue 120, Acid Blue 167, Acid Blue 229, Acid Blue 234, Acid Blue 254, Direct Blue 6, Direct Blue 22, Direct Blue 25, Direct Blue 71, Direct Blue 78, Direct Blue 86, Direct Blue 90, Direct Blue 106, Direct Blue 199, and dyes represented by the following compounds (39) and (40):

(39)

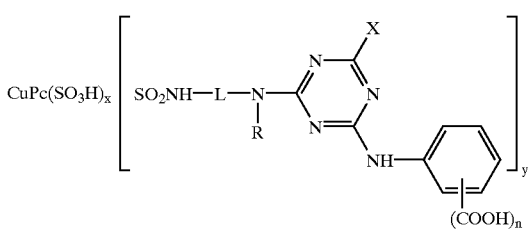

wherein x+y=3 or 4, X=H, NH$_2$ or CH$_3$, R=H or CH$_2$, —L—=—CH$_2$CH$_2$—,

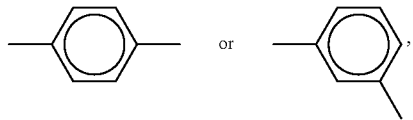

and n=1 or 2;

(40)

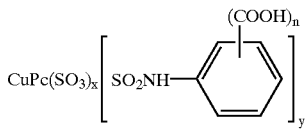

wherein x+y=3 or 4.

In addition to these known coloring agents, newly developed compounds can also be used in the present invention without limitation, as long as the compounds satisfy hue, light resistance, and solubility requirements.

A2-4. Cationic Color Dye

Cationic dyes generally have clear hue and good coloring characteristics, although they are slightly inferior to pigments in light resistance. Thus, these dyes can also be used in the present invention by selecting the type of light and by optimizing the irradiation time. Cationic dyes have basic structures, such as cyanine, azo, azomethine, xanthene, triphenylmethane, methine, polymethine, and phthalocyanine. Examples of cationic color dyes include C.I. Basic Yellow 1, C.I. Basic Yellow 11, C.I. Basic Yellow 13, C.I. Basic Yellow 19, C.I. Basic Yellow 21, C.I. Basic Yellow 25, C.I. Basic Yellow 33, C.I. Basic Yellow 36, C.I. Basic Red 1, C.I. Basic Red 2, C.I. Basic Red 9, C.I. Basic Red 12, C.I. Basic Red 13, C.I. Basic Red 38, C.I. Basic Red 39, C.I. Basic Red 92, C.I. Basic Blue 1, C.I. Basic Blue 3, C.I. Basic Blue 5, C.I. Basic Blue 9, C.I. Basic Blue 19, C.I. Basic Blue 24, C.I. Basic Blue 25, C.I. Basic Blue 26, C.I. Basic Blue 28, C.I. Basic Blue 45, C.I. Basic Blue 54, and C.I. Basic Blue 65. Various combinations of these cationic color dyes may produce a cationic black dye.

B. Polymerizable Oligomer

As described above, preferable polymerizable oligomers have two or more acryloyl groups in each molecule and have a solubility in water of 10 percent by weight or more. The polymerizable oligomer, which is generally present in a liquid state, has fundamental characteristics, such as being hydrophilic, highly hygroscopic, and nonvolatile, as a solvent component in an aqueous ink-jet ink. The most important property of the polymerizable oligomer is rapid polymerization by ultraviolet ray irradiation after printing. The oligomer is solidified by polymerization to fix the coloring agent on a recording medium such as paper. The rapid polymerization can effectively prevent undesirable mixing with other color inks and contamination of the output recording medium; hence, the printing rate can be increased.

Examples of polymerizable oligomers used in the present invention include acrylic or methacrylic esters of multivalent alcohols and acrylic or methacrylic esters of glycidyl ethers derived from the multivalent alcohols. The multivalent alcohols may be chain-extended by addition of ethylene oxide. These aqueous nonionic polymerizable oligomers (not having dissociating groups) can be used for preparation of both cationic inks and anionic inks.

Examples of the nonionic oligomers are represented by the following formulae (2) to (5):

Nonionic Oilgomer 1 (2)

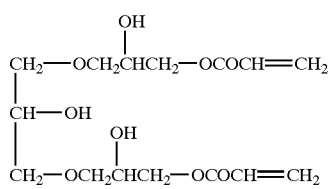

Nonionic Oilgomer 2 (3)

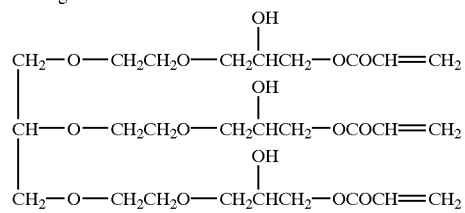

Nonionic Oilgomer 3 (4)

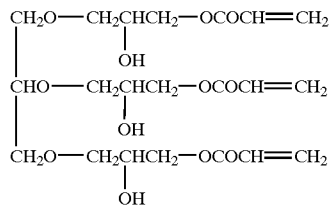

Nonionic Oilgomer 4 (5)

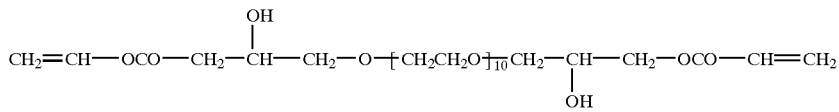

The solubility in water of each nonionic oligomer is shown in the following table.

|  | Solubility in Water (%) |
|---|---|
| Nonionic Oligomer 1 | >20 |
| Nonionic Oligomer 2 | >20 |
| Nonionic Oligomer 3 | 15 |
| Nonionic Oligomer 4 | >20 |

In addition to these polymerizable oligomers, nonionic acrylic esters which are derived from polyhydroxyl compounds and have two or more acryloyl groups in each molecule are also used in the present invention. Examples of the polyhydroxyl compound include condensation products of glycols, oligoethers, and oligoesters.

Further examples of preferable nonionic water-soluble polymerizable oligomers include acrylic or methacrylic esters of polyols having at least two hydroxyl groups, such as monosaccaride and disaccharide; and acrylic or methacrylic esters of triethanolamine, diethanolamine, trishydroxyaminomethane or trishydroxyaminoethane. These oligomers also have fundamental characteristics essential for aqueous ink in accordance with the present invention.

A preferable aqueous cationic polymerizable oligomer has a basic structure selected from the above-mentioned nonionic oligomers and has at least one type of cationic group. An aqueous solvent in an aqueous ink may be partly or completely replaced with the cationic polymerizable oligomer to reduce or eliminate the solvent in the ink. The cationic polymerizable oligomer further enhances cationic characteristics of an aqueous black ink, and thus effectively prevents color mixing when the black ink comes into contact with an anionic ink during printing.

Further examples of basic structures of polymerizable oligomers having cationic groups are represented by the following formulae (6) to (17):

Basic Structure 1 (6)

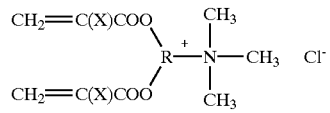

Basic Structure 2 (7)

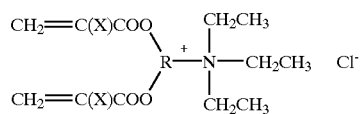

Basic Structure 3 (8)

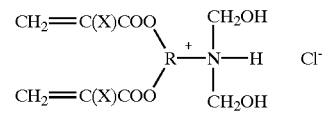

Basic Structure 4 (9)

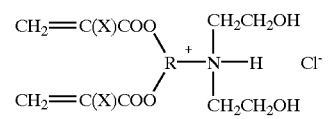

Basic Structure 5 (10)

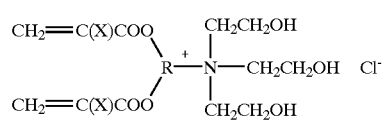

Basic Structure 6 (11)

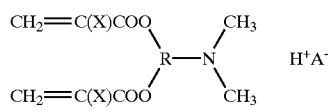

Basic Structure 7 (12)

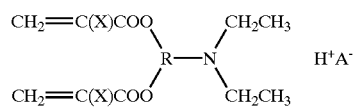

Basic Structure 8 (13)

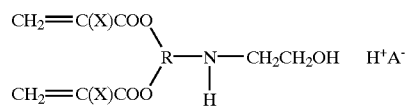

Basic Structure 9 (14)

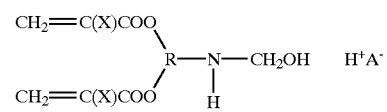

Basic Structure 10 (15)

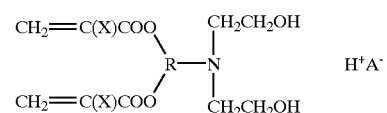

Basic Structure 11 (16)

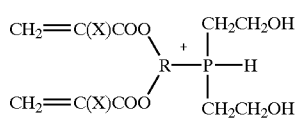

Basic Structure 12 (17)

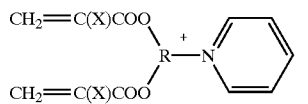

wherein R is a polyol moiety, X is hydrogen or $CH_3$, and $A^-$ is $Cl^-$, $HSO_3^-$ or $CH_3COO^-$.

These polymerizable oligomers also have a solubility in water of 10% or more. Examples of polyol sources include glycerin, 1,2,4-butanetriol, 1,2,5-pentanetriol, 1,2,6-hexanetriol, trimethylolpropane, trimethylolmethane, trimethylolethane, pentaerythritol, bisphenol A, alicyclic bisphenol A, and condensation products thereof.

Examples of polymerizable oligomers having cationic groups are represented by the following formulae (18) to (28):

Cationic Oligomer 1 (18)

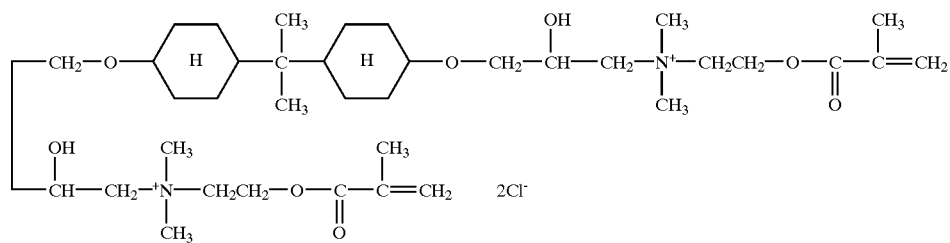

wherein  represents cyclohexane;

Cationic Oligomer 2 (19)

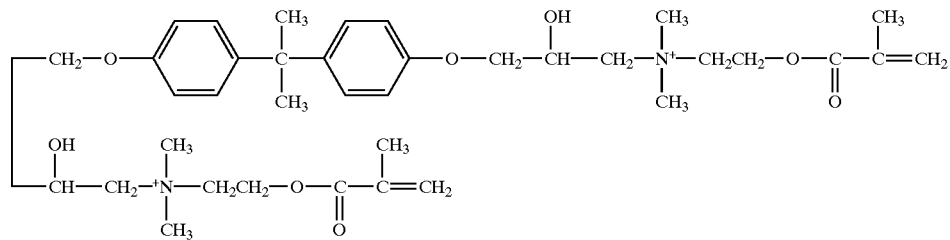

Cationic Oligomer 3
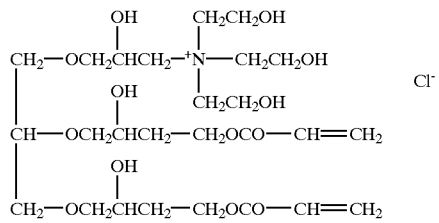
(20)
Cationic Oligomer 4
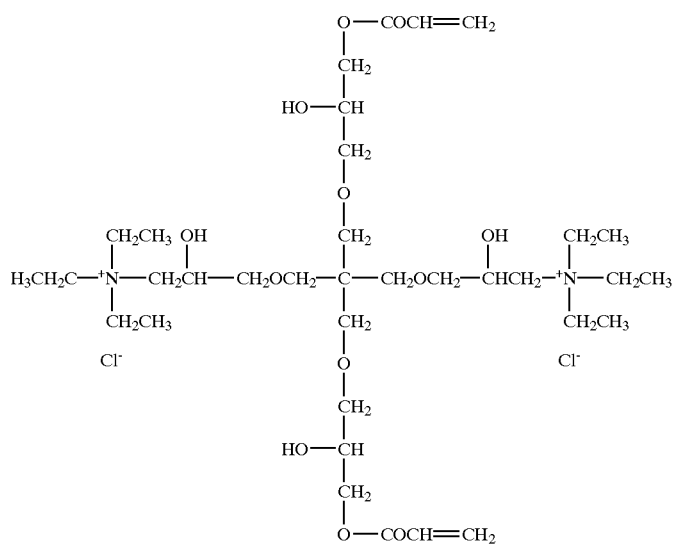
(21)
Cationic Oligomer 5
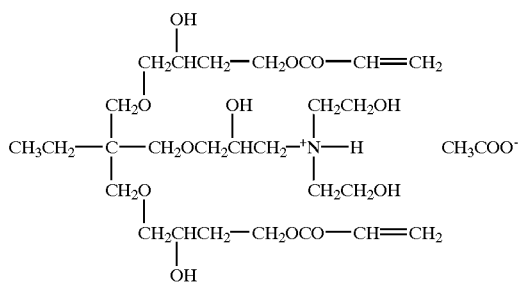
(22)
Cationic Oligomer 6
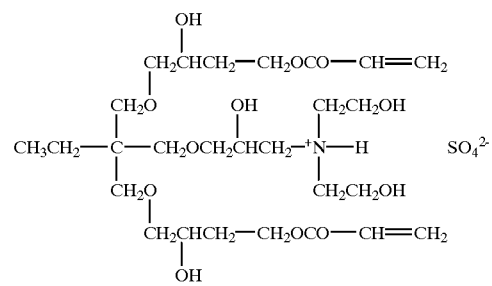
(23)
Cationic Oligomer 7
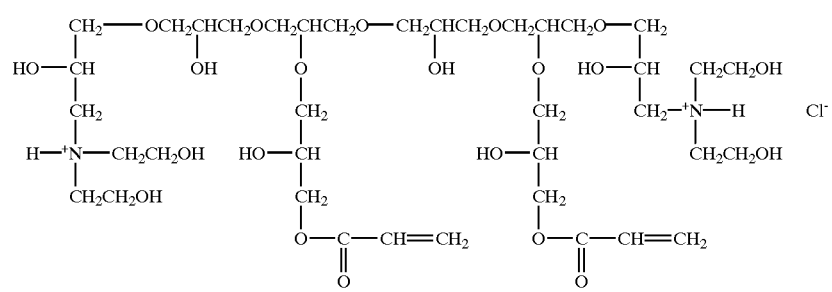
(24)

Cationic Oligomer 8

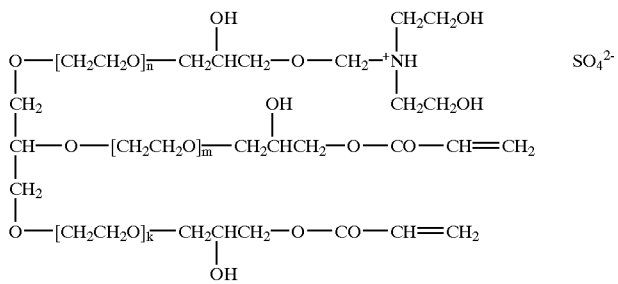
(25)

wherein n+m+k=15;

Cationic Oligomer 9

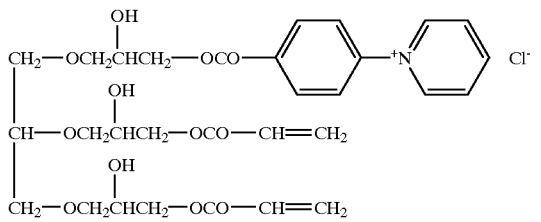
(26)

Cationic Oligomer 10

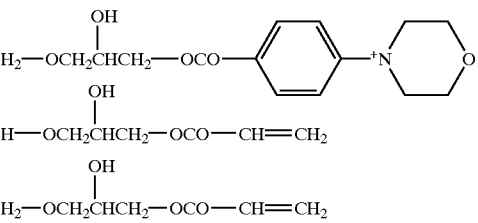
(27)

Cationic Oligomer 11

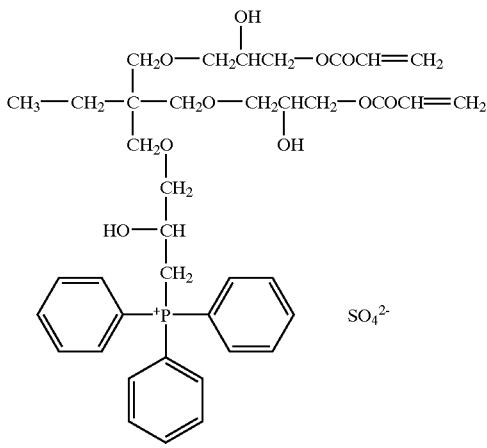
(28)

The above polymerizable oligomers having high polymerization rates show good adhesiveness on recording media and good miscibility in ink, and achieve good transparency in the image without causing a change in hue. Polymerizable oligomers having cationic groups show better solubility in water due to enhanced hygroscopic properties. Since the cationic oligomers react with nonionic dyes or dispersants in aqueous color inks to form salts or to coagulate, they can effectively suppress color bleeding and can be rapidly bonded to recording media. Accordingly, use of the polymerizable oligomers achieves satisfactory printing.

These polymerizable oligomers can be used in aqueous black inks and aqueous color inks. Examples of other polymerizable oligomers preferably used in color inks also include acrylates, such as DENACOL (trade name, manufactured by Nagase Chemical Ltd.), and acrylic esters of water-soluble epoxy resins, such as DENACOL EX 512 and DENACOL DA931.

The polymerizable oligomer is added in an amount of 1 to 30 parts by weight to 100 parts by weight of ink, regardless of the type of the coloring agent, that is, a pigment or a dye, and the type of the ink, that is, a cationic ink or an anionic ink. A preferable amount of the polymerizable oligomer is in a range of 5 to 20 parts by weight, although the amount is determined in view of the amount of the coloring agent, and viscosity of the polymerizable oligomers. The preferable range further improves adhesiveness of the coloring agent on a recording medium, water resistance of the printed image, transparency of the polymer itself, curing characteristics during polymerization, preservation stability of the ink, and physical properties of the cured ink.

A water-soluble cationic polymerizable oligomer having at least two acryloyl groups, which is used with a black cationic pigment dispersion to produce a black ink, has a high solubility in water of 10 percent by weight or more, and has high moisture retention since it has a cationic group.

C. Photopolymerization Initiator

The photopolymerization initiator in accordance with the present invention has a solubility in water of 3 percent by weight or more, and initiates polymerization of a polymerizable oligomer contained in an ink to form a polymer containing a coloring agent, such as a black pigment, as an inclusion so that the coloring agent is fixed to a recording medium.

Any type of photopolymerization initiator can be used without limitation in the present invention, as long as the initiators form radicals by light irradiation, have a solubility in water of 3 percent or more, and do not react with other components in the ink, such as the coloring agent.

C1. Nonionic Photopolymerization Initiator

Nonionic photopolymerization initiators can be used in inks containing anionic dyes or cationic dyes, inks containing pigment coloring agents dispersed in anionic or cationic dispersants, and inks containing self-dispersing carbon black as a coloring agent having surface anionic or cationic groups. A nonionic photopolymerization initiator having a solubility in water of 3 percent or more may be selected from known nonionic photopolymerization initiators or may be prepared by modifying a known initiator to improve its solubility. Examples of such nonionic photopolymerization initiators include compounds having hydroxyl groups, e.g., 1-hydroxycyclohexyl phenyl ketone (trade name: Irgacure 184, made by Ciba Specialty Co.), 2-hydroxy-2-methyl-1-phenyl-propan-1-one (trade name: Darocur 1173, made by Ciba Specialty Co.), and 4-(2-hydroxyethyoxy)-phenyl-(2-hydroxy-2-methylpropyl) ketone (trade name: Irgacure 2959, made by Ciba Specialty Co.); and modified compounds thereof that were modified to improve solubility in water. An ethylene-oxide-added compound which is prepared by modification of Irgacure 2959 and is represented by the following formula (1) has a solubility in water of 3 percent or more, and substantially 20 percent or more, and is highly soluble in an aqueous 50%-glycerin solution; hence, this photopolymerization initiator is preferably used in the present invention:

(1)

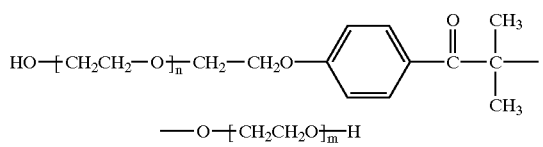

wherein n is an integer of 1 or more, m is an integer of 0 or more, the sum of n and m is in a range of 1 to 8, and n is in a range of 1 to 8 when m is zero.

When n is zero, the resulting initiator does not have sufficient solubility in water. When the sum (x) of n and m is 1 and when n is 1 and m is zero, the ink does not have satisfactory preservation stability or satisfactory discharging characteristics in practical use, regardless of increased solubility. When the sum is 9 or more, the resulting photopolymerization initiator has a large molecular size and causes economical disadvantages due to an increase in the content in ink, although the activity of the initiator does not decrease.

A structure which is essential for radical cleavage for ultraviolet curing is an atomic group having a hydroxyl group or an atomic group equivalent to the hydroxyl group at the α-position. Between the following processes, the second process is preferable, because it is difficult to control the number of "m" and "n" in the first process. It is clarified in the present invention that substitution of the α-hydroxyl group by an ether does not inhibit radical formation, as shown in the above formulae. Addition of ethylene oxide in an amount up to eight equivalents is reasonable in practice. The photopolymerization initiator represented by the formula (1) does not have an ionizing group, and is preferably used together with a water-soluble anionic dye or an aqueous pigment dispersion. This compound is prepared by the following processes.

1. First Process (Addition of Ethylene Glycol Group)

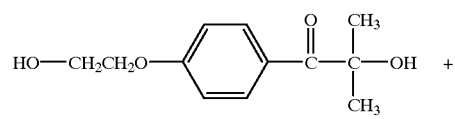

+

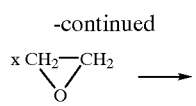

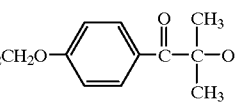

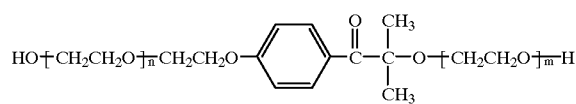

wherein x=n+m;

2. Second Process (Addition of Hydroxyl Group)

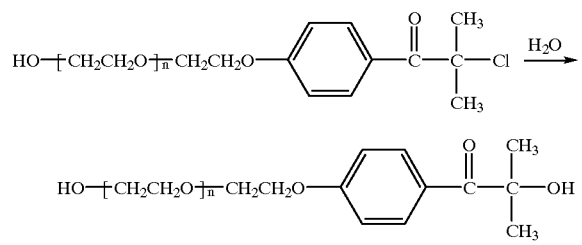

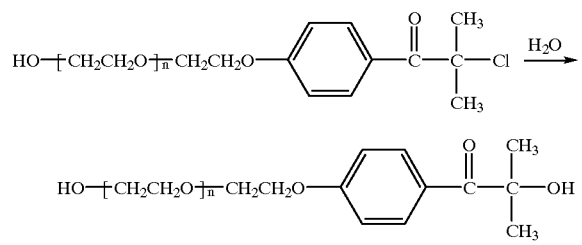

Examples of photopolymerization initiators are represented by the following formulae (29) to (33):

Photopolymerization Initiator 1

(29)

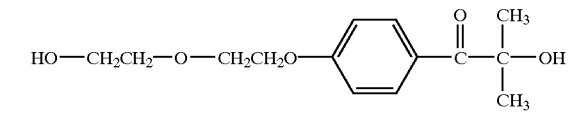

Photopolymerization Initiator 2

(30)

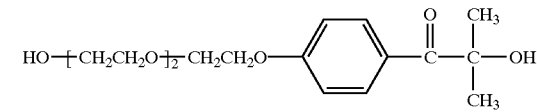

Photopolymerization Initiator 3

(31)

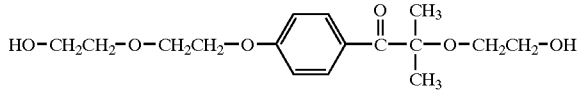

Photopolymerization Initiator 4

(32)

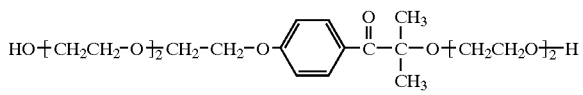

Photopolymerization Initiator 5

(33)

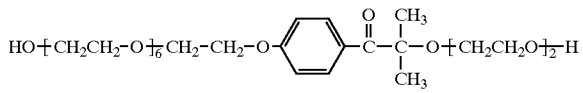

The following table shows the solubility of each compound.

| | Solubility in Water | Solubility in Water/Glycerin (50:50) |
|---|---|---|
| Compound 29 | 4% | >10% |
| Compound 30 | >10% | >20% |
| Compound 31 | >20% | >20% |
| Compound 32 | >20% | >20% |
| Compound 33 | >20% | >20% |

A water-soluble solvent, which can dissolve the above-mentioned compounds and is miscible with water, may be used as a medium of an aqueous ink. Examples of water-soluble solvents include benzoin ethers, e.g., benzoin methyl ether, benzoin ethyl ether, and benzoin isopropyl ether; acryloxime esters; dialkoxyacetophenones, e.g., p-dimethylaminoacetophenone and 2,2-diethoxyacetophenone; chloroacetophenones, e.g., 2-chlorothioxanthone; benzylketals, e.g., benzyldimethylketal; benzophenone; and mixtures thereof with hydrogen-donating aryl amines.

The above-mentioned Irgacure 184 and Darocur 1173, each having one hydroxyl group per molecule, may have two to ten ethylene oxide chains in each molecule. Such initiators further improve solubility in water.

C2. Cationic Photopolymerization Initiator

When the ink contains a coloring agent, such as a cationic dye, a pigment dispersed in a cationic dispersant, or a self-dispersing carbon black having surface cationic groups, a cationic photopolymerization initiator can also be used, as well as the above nonionic photopolymerization initiator. When a cationic pigment or dye having a solubility in water of 3% or more is used, a cationic photopolymerization initiator having a solubility in water of 30% or more can be used. Examples of such a compound are represented by the following formulae:

(1) 4-benzoyl-N,N,N-trimethylbenzen methane ammonium chloride

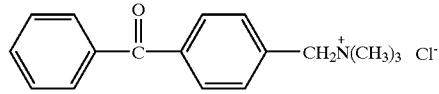

(2) 2-hydroxy-3-(4-benzoyl-phenoxy)-N,N,N-trimethyl-1-propane ammonium chloride

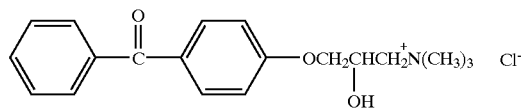

(3) 4-benzoyl-N,N-dimethyl N-[2-(1-oxo-2-propenyloxy)ethyl]benzene methane ammonium chloride

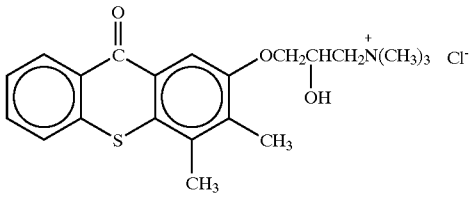

Other hydrophilic polymerization catalysts preferably used in the present invention are disclosed by Manfred Kohler (Ciba Specialty Co.) in European Coatings Journal, 12/97, pp. 1118–1120, "A versatile α-hydroxyketone photoinitiator".

The content of the photopolymerization initiator in the ink for achieving a satisfactory curing rate is in the range of 0.3 to 10 parts by weight, and is preferably 1 to 5 parts by weight, with respect to 100 parts by weight of the ink.

D. Solvent

An aqueous solvent is used in an aqueous black or color ink. The aqueous solvent may contain a water-soluble organic solvent, if necessary. Examples of water-soluble organic solvents include ethylene glycol, diethylene glycol, triethylene glycol, tripropylene glycol, glycerin, 1,2,4-butanetriol, 1,2,6-hexanetriol, 1,2,5-pentanetriol, 1,2-butanediol, 1,3-butanediol, 1,4-butanediol, dimethyl sulfoxide, diacetone alcohol, glycerin monoallyl ether, propylene glycol, butylene glycol, polyethylene glycol 300, thiodiglycol, N-methyl-2-pyrrolidone, 2-pyrrolidone, γ-butyrolactone, 1,3-dimethyl-2-imidazolididone, sulfolane, trimethylolpropane, trimethylolethane, neopentyl glycol, ethylene glycol monomethyl ether, ethylene glycol monoethyl ether, ethylene glycol monoisopropyl ether, ethylene glycol monoallyl ether, diethylene glycol monomethyl ether, diethylene glycol monoethyl ether, triethylene glycol monomethyl ether, triethylene glycol monoethyl ether, propylene glycol monomethyl ether, dipropylene glycol monomethyl ether, β-dihydroxyethylurea, urea, acetonylacetone, pentaerythritol, and 1,3-cyclohexanediol. These solvents may be used in combination.

Further examples of solvents include hexylene glycol, ethylene glycol monopropyl ether, ethylene glycol monobutyl ether, ethylene glycol monoisobutyl ether, ethylene glycol monophenyl ether, diethylene glycol diethyl ether, diethylene glycol monobutyl ether, diethylene glycol monoisobutyl ether, triethylene glycol monobutyl ether, triethylene glycol dimethyl ether, triethylene glycol diethyl ether, tetraethylene glycol dimethyl ether, tetraethylene glycol diethyl ether, propylene glycol monobutyl ether, dipropylene glycol monomethyl ether, dipropylene glycol monopropyl ether, dipropylene glycol monobutyl ether, tripropylene glycol monomethyl ether, glycerin monoacetate, glycerin diacetate, glycerin triacetate, ethylene glycol monomethyl acetate, diethylene glycol monomethyl ether acetate, cyclohexanol, 1,2-cyclohexanediol, 1-butanol, 3-methyl-1,5-pentanediol, 3-hexene-2,5-diol, 2,3-butanediol, 1,5-pentanediol, 2,4-pentanediol, and 2,5-hexanediol. Monovalent alcohols may be used in combination to adjust penetrability and wettability. Examples of the monovalent alcohol include ethanol, 1-propanol, 2-propanol, 1-methoxy-2-propanol, furfuryl alcohol, and tetrahydrofuran.

The aqueous solvents may be added in a total amount of 5 to 40 percent by weight of the ink.

In the aqueous ink in accordance with the present invention, the polymerizable oligomer functions not only as an inhibitor of water evaporation, but also as a solvent, thus, when the ink contains a high content of the oligomer, it is preferable to avoid using the aforementioned water-soluble organic solvent.

E. Ink Formulation

The content of each component in the ink will now be described. The dye content in the ink is in the range of 0.5 to 7.0 percent by weight. The pigment content in the ink is in the range of 0.5 to 10 percent by weight. In recent years, inks having low coloring agent contents, that is, thin inks, have been frequently used to enhance reproducibility of half-tone images. In such a case, the dye or pigment content may be in the range of 0.1 to 1.0 percent by weight.

Method for Making Ink

In the production of ink, raw materials may be mixed in any order. Preferably, mixing of the above ingredients is performed rapidly so that a nonhomogeneous state does not continue for a long time. When a pigment dispersion is used, vigorous agitation is preferable to achieve a homogeneous mixing state.

Ink Characteristics

The ink in accordance with the present invention is preferably used in a recording method which discharges ink droplets by applying mechanical energy to the ink, and a recording method which discharges ink droplets by bubbling of the ink by applying thermal energy to the ink. When the ink is used in ink-jet recording, it is preferable that the ink have precise discharging characteristics from an ink-jet head. In order to produce a high-quality image on a recording medium, it is preferable that the ink characteristics be adjusted to maintain a dotted shape having a desired size on the recording medium. In view of discharging characteristics from the ink-jet head and ink behavior immediately after discharge onto a recording medium, the ink preferably has a viscosity of 1 to 15 cps, and a surface tension of 25 dyne/cm or more. More preferably, the ink has a viscosity of 1 to 5 cps, and a surface tension of 25 to 50 dyne/cm.

As the most noticeable feature in the present invention, highly water-soluble materials, such as a polymerizable oligomer and a photopolymerization initiator, are used. Since an organic solvent for dissolving the oligomer and the initiator is not added to the ink, the ink has superior ink-jet characteristics regardless of addition of the oligomer and the initiator.

Ink Set (Combination of Anionic Ink and Cationic Ink)

When a black ink and a color ink are used in combination as a set of inks to form a multicolor image, it is preferable that the black ink and the color ink have polarities opposite to each other. At the boundary of the black ink and the color ink on a recording medium, the anionic component and the cationic component react with each other before photocuring of the inks. Thus, bleeding between the uncured inks can be effectively prevented by the synergism of the photocuring and the ionic reaction.

Printer System

Figure 2:
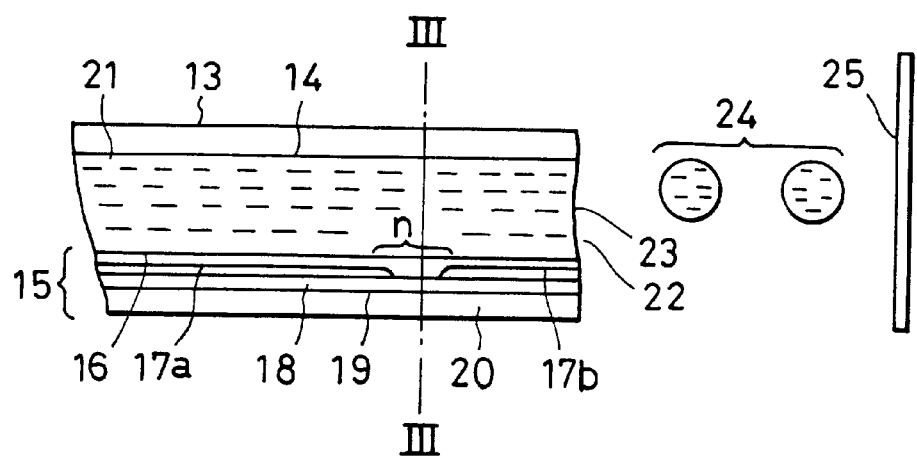
FIG. 2 is a longitudinal cross-sectional view of an embodiment of a head of an ink-jet recording apparatus.
Figure 3:
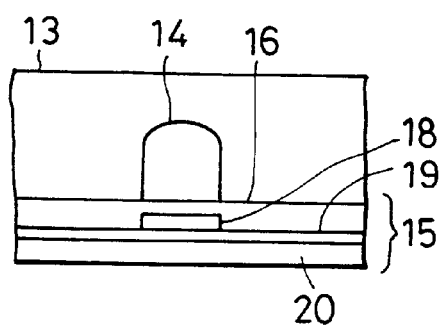
FIG. 3 is a cross-sectional view taken along line III—III in FIG. 2.

With reference to FIG. 1, a printer system which is preferably used in the present invention includes a conventional ink-jet printing mechanism 2 and a light exposure unit 5 such as an ultraviolet exposure unit. The ultraviolet exposure unit 5 irradiates the printed face of recording paper 4 which is introduced from a feeder 3 and expelled from a printing station 1. The best timing of the irradiation is in a state in which the ink components are uniform before the ink completely penetrates into the recording paper. Practical printing operations, however, are performed using various types of recording paper having different penetration characteristics. Thus, it is preferable that the ultraviolet lamp puts near the print head as close as possible. A preferable ultraviolet lamp is a low-pressure mercury lamp having a vapor pressure of mercury of 1 to 10 Pa when turned on, or a lamp in which are gas is sealed. The emission spectra in an ultraviolet region of the low-pressure mercury lamp have a maximum in the range of 184 nm to 450 nm which is suitable for effective polymerization of the components in the black and color inks. Furthermore, this lamp can work by a compact electrical power source. Examples of other ultraviolet lamps used in the present invention include a metal halide lamp, a high-pressure mercury lamp, an ultrahigh-pressure mercury lamp, a lamp in which are-earth element is used a xenon flash lamp, and a deep UV lamp. These lamps also have substantially the same emission spectra. The intensity of the ultraviolet light is preferably in the region of 10 to 50 $W/cm^2$ to control the polymerization rate within a desired range, although it can be selected in response to the sensitivity of the photopolymerization initiator. If the intensity is too low, the ink on the recording paper does not have sufficient bonding force, and in particular, the color ink does not have sufficient water resistance. Curing of the ink on the recording paper by ultraviolet light having an optimized intensity imparts satisfactory fixing characteristics, high smear resistance, and high water resistance to the ink. Furthermore, the curing suppresses curling and cockling of the recording paper, and thus facilitates handling and preservation of the paper. ps Ink-Jet Recording Apparatus FIG. 2 is a longitudinal cross-sectional view of a head of an ink-jet recording apparatus which is used in the printer system shown in FIG. 1, and FIG. 3 is a cross-sectional view taken along line III—III in FIG. 2. A head 13 is formed by bonding a plate provided with channels or nozzles for conducting ink to a heating element 15. The plate may be composed of glass, ceramic, silicon, or plastic. The heating element 15 includes a protective layer 16 composed of silicon dioxide, silicon nitride, or silicon carbide, electrodes 17a and 17b composed of aluminum, gold, or an aluminum-copper alloy, a thermistor layer 18 composed of a high-melting point material such as $HfB_2$, TaN, or TaAl, a heat accumulating layer 19 composed of thermally oxidized silicon or aluminum oxide, and a substrate 20 composed of a material having high heat dissipating characteristics, such as silicon, aluminum, or aluminum nitride.

When an electrical pulse signal is applied between the electrodes 17a and 17b, the region n of the heating element 15 is rapidly heated. A bubble forms in the ink 21 which comes into contact with the region n in the nozzle 14 and causes expansion of the ink. The meniscus 23 is thereby protruded and the ink is discharged as droplets 24 through a discharging orifice 22 towards a recording medium 25.

Figure 4:
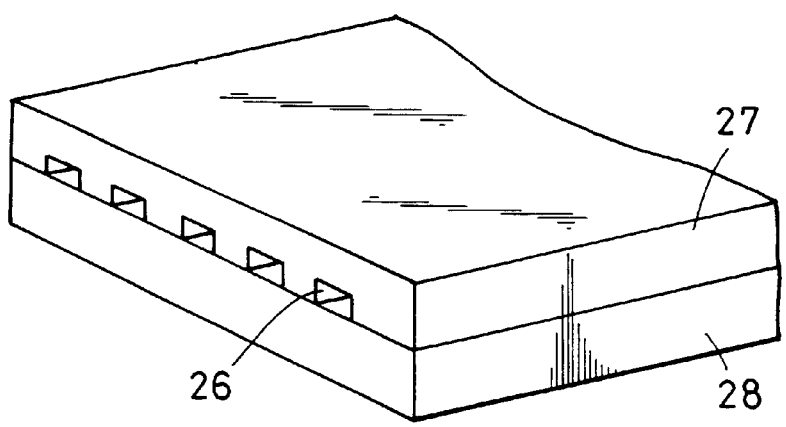
FIG. 4 is an outline view of a multihead.

FIG. 4 is an outline view of a multihead which consists of a plurality of heads, as shown in FIG. 2. The multihead is formed by bonding a glass plate 27 having a plurality of nozzles 26 and a thermistor layer 28 similar to that in FIG. 2.

Figure 5:
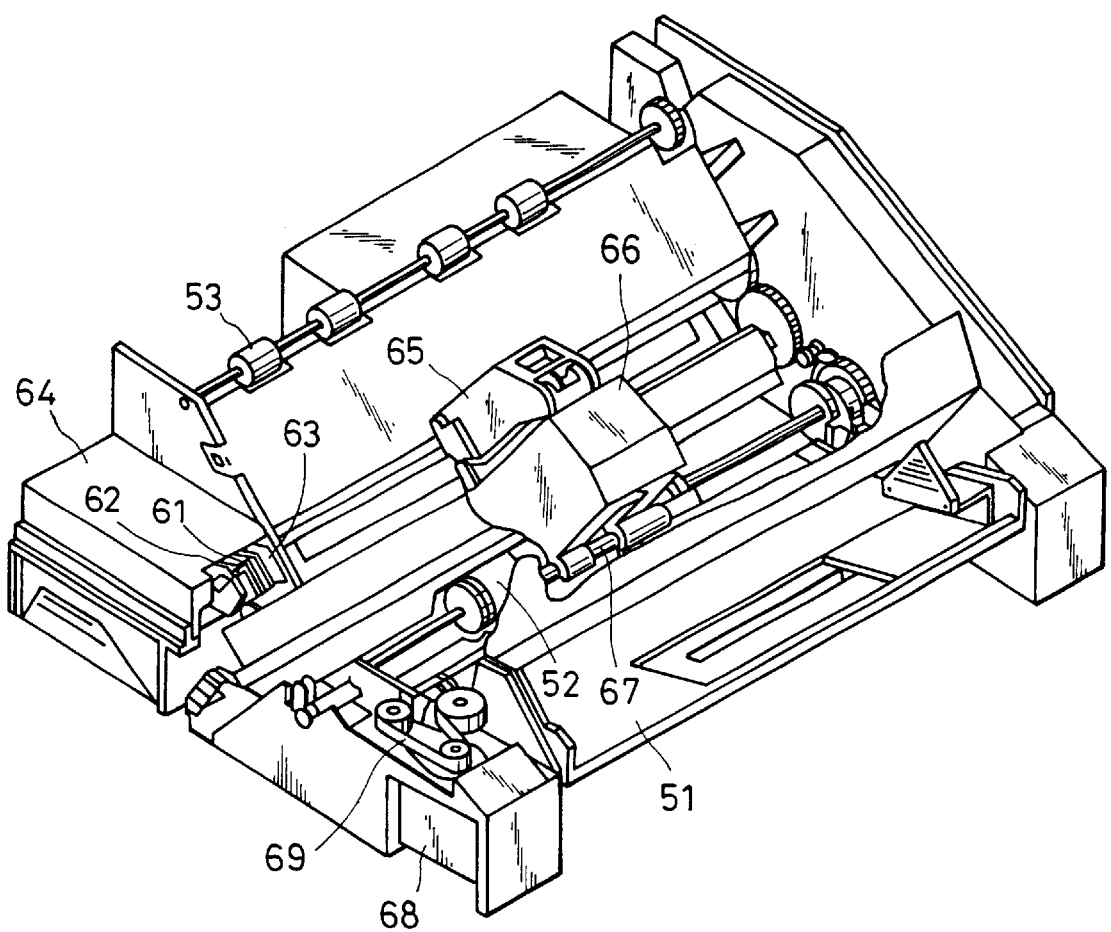
FIG. 5 is an isometric outline view of an embodiment of an ink-jet recording apparatus.

FIG. 5 is an isometric outline view of an ink-jet recording apparatus provided with one of the above heads. One end of a wiping blade 61 is supported by a blade-supporting member like a cantilever, at a home position adjacent to the recording region by a recording head 65. In this embodiment, the blade 61 is protruded from the path of movement of the recording head 65. The recording head 65 is provided with a cap 62 which moves in the direction perpendicular to the moving direction of the recording head 65 and comes into contact with the ink-discharging face. An ink absorber 63 is provided adjacent to the blade 61 and is protruded from the path of movement of the recording head 65. The blade 61, the cap 62, and the ink absorber 63 constitute a discharge recovery section 64 which removes liquids and dust from the ink-discharging face.

The recording head 65 discharges ink on a recording medium facing the ink-discharging face by thermal energy applied to the recording head 65. The recording head 65 is loaded on a carriage 66. The carriage 66 is supported by a guide axis 67 so as to slide along the guide axis 67, and is connected to a belt 69 driven by a motor 68 (the connection is not shown in the drawing). Thus, the recording head 65 can move between the recording region and the vicinity thereof.

A recording medium is fed from a feeding section 51 so as to face the ink-discharging face of the recording head 65 by a feeding roller 52, and expelled to an expelling section by expelling-rollers 53 driven by a motor (not shown in the drawing) after recording. When the recording head 65 returns to the home position after completion of recording, the cap 62 of the discharge recovery section 64 is withdrawn from the path of movement of the recording head 65 whereas the blade 61 is protruded from the path of movement to wipe the ink-discharging face of the recording head 65. Then, the cap 62 moves towards the path of movement to cover the ink-discharging face of the recording head 65. When the recording head 65 shifts from the home position, the cap 62 is withdrawn from the path of movement whereas the blade 61 is protruded from the path of movement. Thus, the blade 61 wipes the ink-discharging face of the recording head 65 again.

The recording head 65 preferably returns to the home position for wiping in a given time interval during the recording operation, in addition to the discharge recovery operation and the completion of the recording operation.

Ink Cartridge

Figure 6:
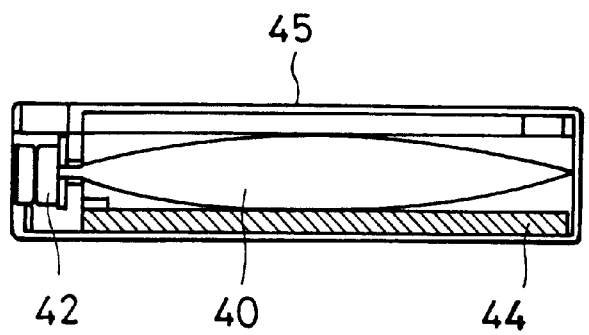
FIG. 6 is a longitudinal cross-sectional view of an embodiment of an ink cartridge.

FIG. 6 is a longitudinal cross-sectional view of an embodiment of an ink cartridge 45. The ink cartridge 45 has an ink reservoir 40, such as an ink bag, and the end of the ink reservoir 40 is capped with a rubber stopper 42. A needle (not shown in the drawing) is inserted in the stopper 42 when the ink in the ink bag 40 is fed to the recording head. Waste ink in the ink cartridge 45 is absorbed by an ink absorber 44. Preferably, the face of the ink reservoir 40 in contact with the ink is formed of polyethylene.

Recording Unit

Figure 7:
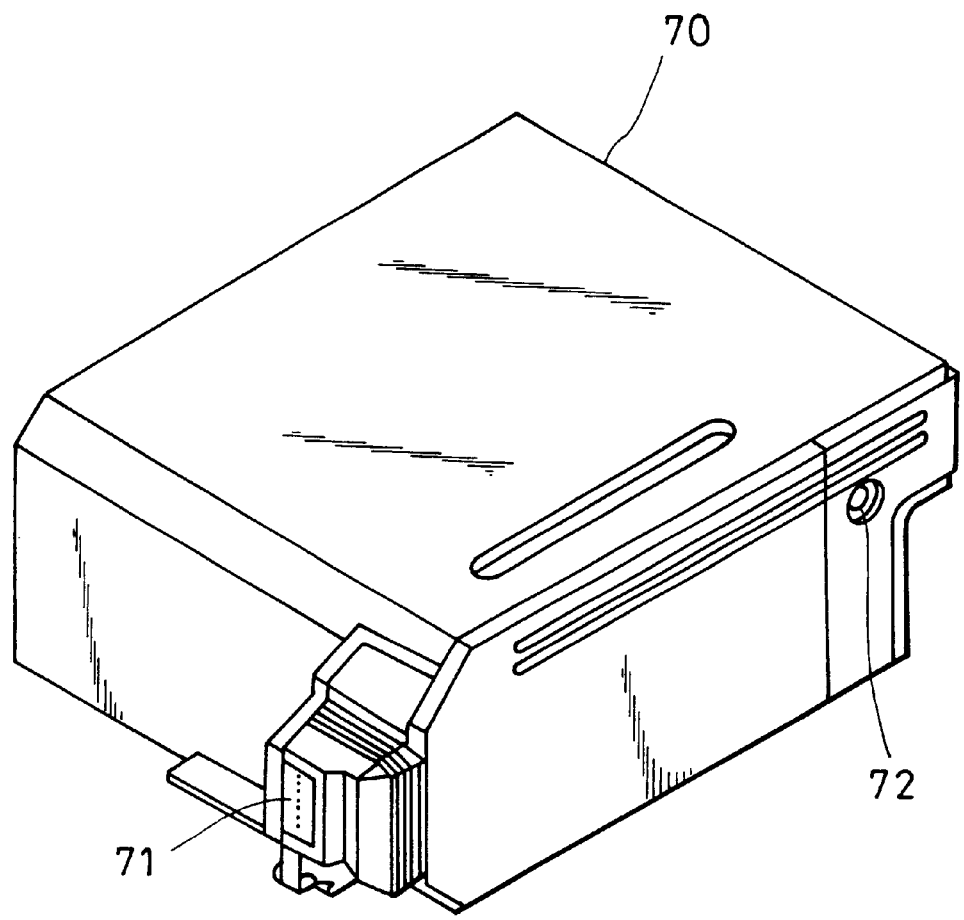
FIG. 7 is an isometric view of an embodiment of a recording unit.

In the ink-jet recording apparatus used in the present invention, the head and the ink cartridge may be separated from each other, as described above, or may be integrated, as shown in FIG. 7. With reference to FIG. 7, a recording unit 70 has an ink reserving section, such as an ink absorber. Ink in the ink absorber is discharged as ink droplets from a head section 71 having a plurality of orifices. In the present invention, a preferable material for the ink absorber is polyurethane.

The ink reserving section may be an ink bag containing a spring or the like, in place of the ink absorber. The recording unit 70 has a hole 72 for introducing outside air to the interior. The recording unit 70 can be substituted for the recording head 65, and thus has a configuration which is detachable from the carriage 66.

Figure 8:
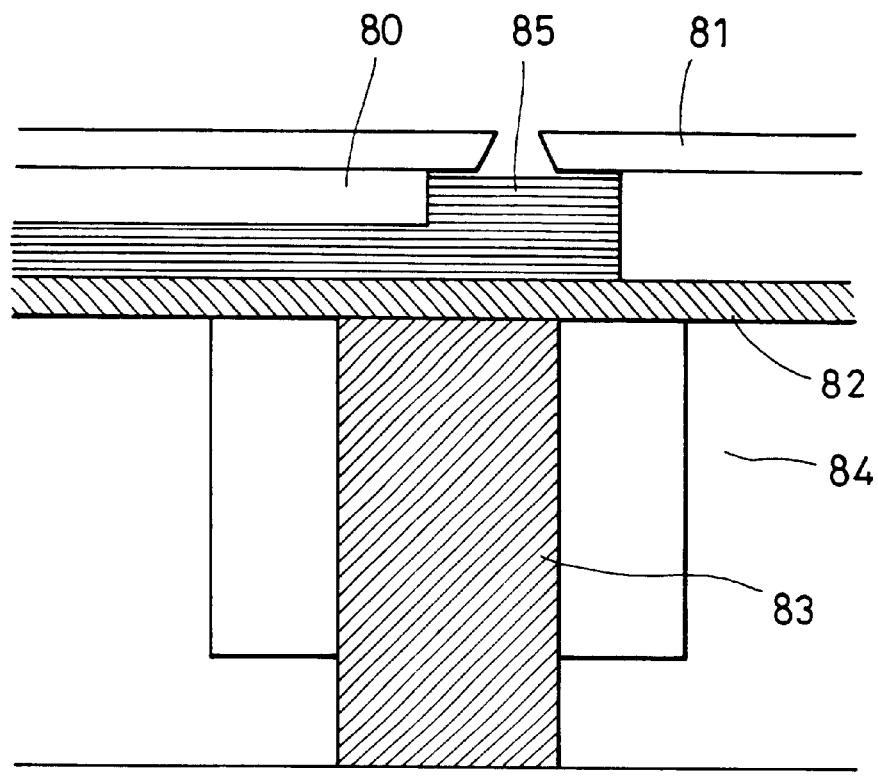
FIG. 8 is an isometric outline view of another configuration of an ink-jet recording head.

FIG. 8 is an isometric outline view of another ink-jet recording head. The ink-jet recording head has a substrate having a plurality of nozzles and a pressure-generating element composed of a piezoelectric material and a conductive material facing the nozzles, and contains ink surrounding the pressure-generating element. The pressure-generating element generates pressure by a voltage applied to it and discharges ink droplets through the nozzles. Such a recording head is called an on-demand ink-jet recording head.

The recording head includes an ink channel 80 connected to an ink chamber (not shown in the drawing), an orifice plate 81 for discharging ink droplets having a desired volume, a vibration plate 82 for applying pressure directly to ink, a piezoelectric element 83 connected to the vibration plate 82 and vibrating by an electrical signal, and a substrate 84 for supporting the orifice plate 81 and the vibration plate 82.

The ink channel 80 is formed of, for example, a photosensitive resin. The orifice plate 81 is formed of stainless steel or nickel, and has a nozzle 85 which is formed by electroforming or press perforation. The vibration plate 82 is formed of a metal film such as stainless steel, nickel, or titanium, or a highly resilient resin film. The piezoelectric element 83 is formed of a dielectric material such as barium titanate or lead zirconium titanate (PZT).

When a pulse voltage is applied to the piezoelectric device 83, the piezoelectric device 83 produces vibration which causes the deformation of the vibration plate 82 connected to the piezoelectric element 83. The vibration plate 82 applies a pressure in a direction perpendicular to the ink in the ink channel 80 to discharge the ink as droplets (not shown in the drawing) through the nozzle 85. This recording head can also be mounted in a recording apparatus, as shown in FIG. 5.

Figure 9:
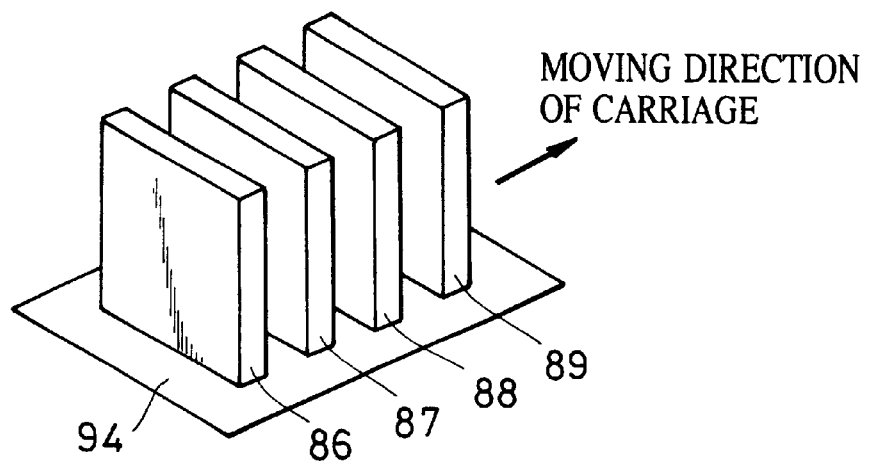
FIG. 9 is an isometric outline view of a recording head provided with four ink cartridges.
Figure 10:
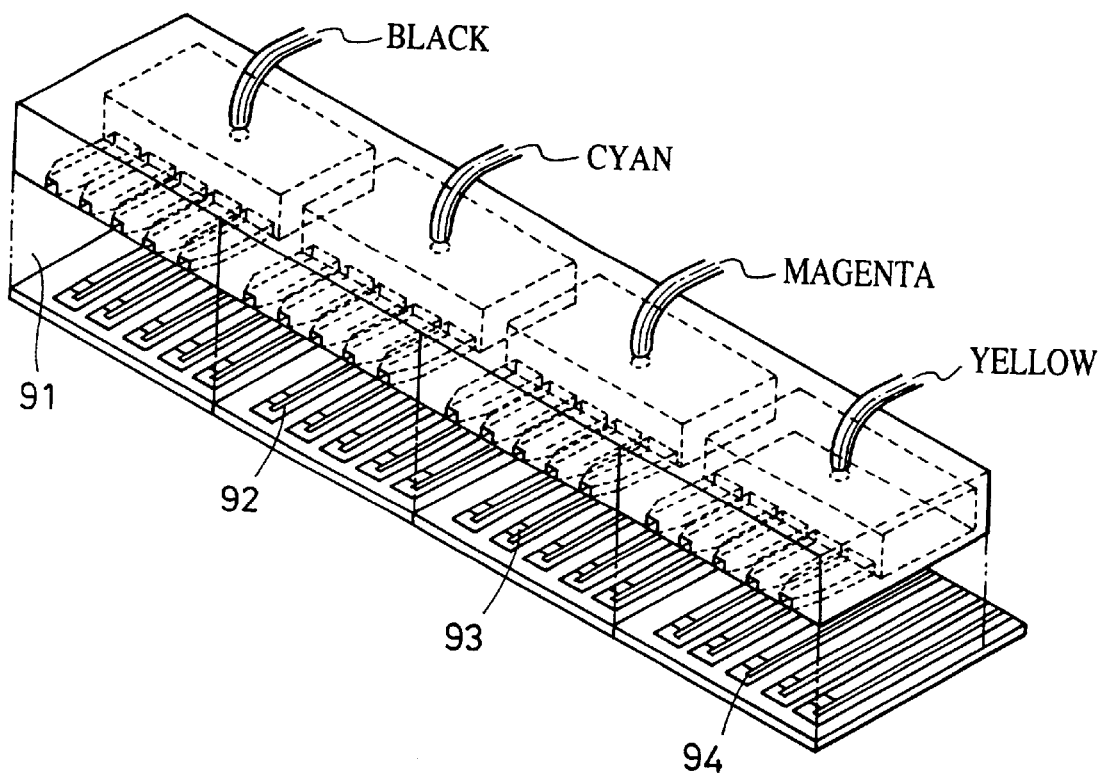
FIG. 10 is an isometric outline view of a configuration of four recording heads arranged on a carriage.

When a color image is recorded using the above-mentioned ink set, a recording apparatus having four recording heads, of the type shown in FIG. 10, arranged in series on a carriage may be used. FIG. 10 is an isometric outline view of a configuration of four recording heads arranged on a carriage. The recording apparatus has a black recording unit 91, a cyan recording unit 92, a magenta recording unit 93, and a yellow recording unit 94. These recording units are arranged on a carriage and discharge color inks in response to recording signals. Although four recording units are used in FIG. 10, four color inks may be independently discharged from one recording head 94, as shown in FIG. 9, having four ink cartridges 86 to 89 and corresponding discharging nozzles.

EXAMPLES

The present invention will now be described in more detail with reference to EXAMPLES.

Synthesis of Photopolymerization Initiator

A photopolymerization initiator represented by the formula (1) was prepared. Into an autoclave, 5 moles (1121.5 g) of a thoroughly dried powder chemical (trade name: Irgacure 2959 made by Ciba Specialty Co.) represented by the following formula was placed. Sodium hydroxide as a catalyst was added thereto and the autoclave was heated to 105° C.

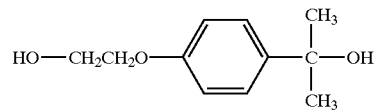

Figure 11:
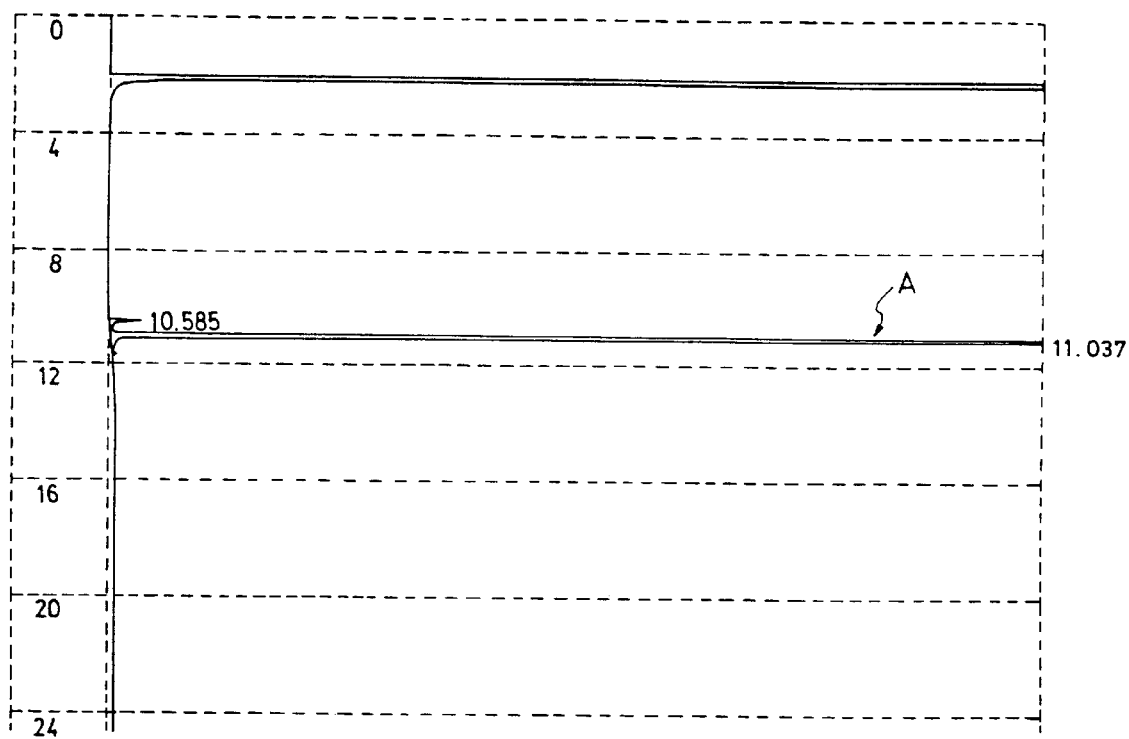
FIG. 11 is a liquid chromatogram of Irgacure 2959.
Figure 12:
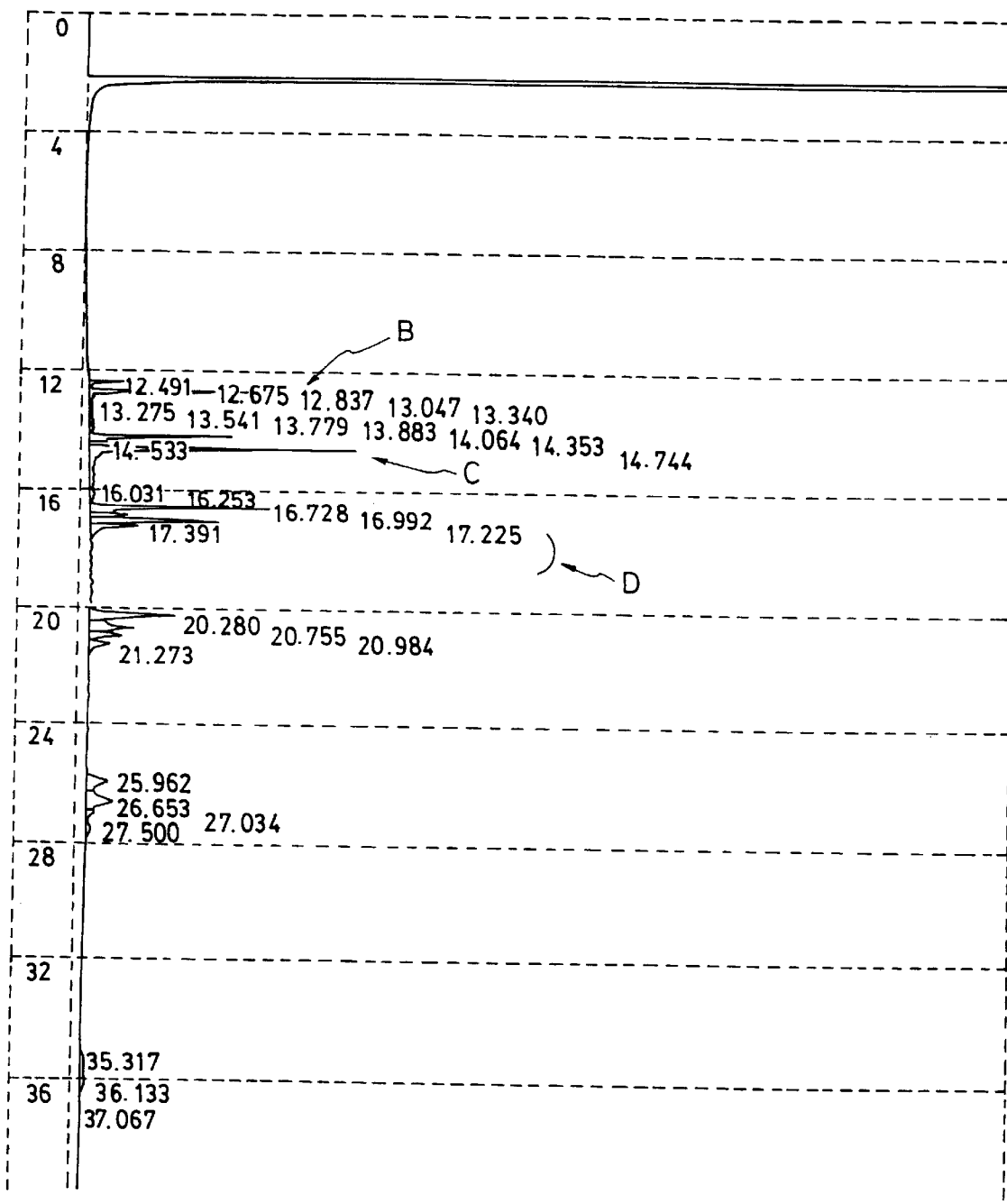
FIG. 12 is a liquid chromatogram of reaction products of Irgacure 2959 with ethylene oxide.

While stirring the contents in the autoclave, 10 moles (440 g) of ethylene oxide was fed at a rate of 5 ml/min into the autoclave and allowed to react at 105° C. for 5 hours. After the completion of the reaction, the solution was neutralized with an aqueous hydrochloric acid solution. The salt was removed through a dialysis membrane, and then the solution was dehydrated. FIG. 11 is a liquid chromatogram of Irgacure 2959 as the starting material, and FIG. 12 is a liquid chromatogram of the reaction products of Irgacure 2959 with ethylene oxide. The starting material has a retention time of 11 minutes (peak A in FIG. 11). The chromatogram shown in FIG. 12 does not have a peak A and suggests the that Irgacure 2959 reacted completely. Furthermore, the chromatogram in FIG. 12 has a peak B at 12.6 minutes corresponding to a 2-mole ethylene oxide adduct of Irgacure 2959 (the sum of m and n in formula (1) is 2), a peak C at 14.5 minutes corresponding to a 4-mole adduct, and peaks D at 16 to 17 minutes corresponding to higher adducts. These products were isolated by a preparative liquid chromatograph.

Example 1

Black, magenta, cyan, and yellow inks were prepared according to the formulations shown in Tables 1 to 6.

TABLE 1

Cationic Black Pigment Ink (BK-1)

| Ingredient | Content (parts by weight) |
| --- | --- |
| IJX-55 (Cationic carbon black made by Cabot Corp.) | 6 |
| Cationic oligomer 7 | 8 |
| Photopolymerization initiator 1 | 1 |
| Diethylene glycol | 10 |
| Water | 75 |

TABLE 2

Cationic Black Pigment Ink (BK-2)

| Ingredient | Content (parts by weight) |
| --- | --- |
| IJX-55 (Cationic carbon black made by Cabot Corp.) | 6 |
| Cationic oligomer 6 | 15 |
| Photopolymerization initiator 1 | 1 |
| Ethylene glycol | 10 |
| Water | 68 |

TABLE 3

Anionic Magenta Pigment Ink (M-1)

| Ingredient | Content (parts by weight) |
| --- | --- |
| Dispersion of Pigment Red 122 *1 | 4 |
| Nonionic oligomer 1 | 10 |
| Photopolymerization initiator 3 | 2 |
| Thiodiglycol | 7 |
| Water | 77 |

Note *1:
Ratio of pigment to polymer dispersant = 10:2 (by weight). Dispersant: styrene-acrylic acid-ethyl acrylate copolymer (number average molecular weight: 9,800, acid value: 190).

TABLE 4

Anionic Cyan Pigment Ink (C-1)

| Ingredient | Content (parts by weight) |
| --- | --- |
| Dispersion of Pigment Blue 15:32 *2 | 5 |
| Nonionic oligomer 1 | 12.5 |

TABLE 4-continued

Anionic Cyan Pigment Ink (C-1)

| Ingredient | Content (parts by weight) |
| --- | --- |
| Photopolymerization initiator 3 | 1.5 |
| Polyethylene glycol 300 | 5 |
| Thiodiglycol | 5 |
| Water | 71 |

Note *2:
Ratio of pigment to polymer dispersant = 10:3 (by weight). Dispersant: styrene-acrylic acid-ethyl acrylate copolymer (number average molecular weight: 9,800, acid value: 190).

TABLE 5

Anionic Yellow Pigment Ink (Y-1)

| Ingredient | Content (parts by weight) |
| --- | --- |
| Dispersion of Pigment Yellow 128 *3 | 5 |
| Nonionic oligomer 1 | 12 |
| Photopolymerization initiator 3 | 1 |
| Polyethylene Glycol 300 | 10 |
| Thiodiglycol | 5 |
| Water | 67 |

Note *3:
Ratio of pigment to polymer dispersant = 10:3.5 (by weight). Dispersant: styrene-acrylic acid-ethyl acrylate copolymer (number average molecular weight: 9,800, acid value: 190).

TABLE 6

Cationic Black Pigment Ink (BK-4)

| Ingredient | Content (parts by weight) |
| --- | --- |
| Dispersion of Color Black No. 960 *4 | 6 |
| Cationic oligomer 8 | 15 |
| Photopolymerization initiator 4 | 1 |
| Glycerin | 10 |
| Ethylene glycol | 5 |
| Water | 63 |

Note *4:
Carbon black dispersion (average particle size: 115 nm) using a copolymer of acrylonitrile, trimethylamino-2-hydroxypropyl methacrylate and acrylamide (monomer ratio by weight = 20:60:20, number average molecular weight: 4,500) as a dispersant. The ratio of the pigment to the dispersant = 10:2.5 (by weight).

Example 2

Using the inks prepared in EXAMPLE 1, images were recorded on plain paper (trade name: plain paper NSK for electrophotographic copy, made by Canon Kabushiki Kaisha) by a bubble-jet printer BJC-430 (made by Canon Kabushiki Kaisha) provided with an ultraviolet lamp, as shown in FIG. 1. The lamp was a low-pressure mercury lamp UL1-5DQ (input power: 50 W, 90 V, 0.6 A) made by Ushio Inc. The time from ink discharge to ultraviolet exposure was approximately 7 seconds, and the exposure time was approximately 5 seconds. An image including black characters and solid color patterns was printed and exposed to ultraviolet light. The printed black letters were clear without bleeding into the solid color patterns. The prints were evaluated as follows. The results are shown in Table 7, with the results of prints not exposed to ultraviolet light for comparison.

TABLE 7

| Ink | UV exposure | Wet smear resistance | Dry smear resistance | Water resistance | Marker resistance |
|---|---|---|---|---|---|
| BK-1 | Exposed | A | A | A | A |
|  | Not exposed | B | B | B | B |
| BK-2 | Exposed | A | A | A | A |
|  | Not exposed | B | B | B | B |
| M-1 | Exposed | A | A | A | A |
|  | Not exposed | B | B | B | B |
| C-1 | Exposed | A | A | A | A |
|  | Not exposed | B | B | B | B |
| Y-1 | Exposed | A | A | A | A |
|  | Not exposed | B | B | B | B |
| BK-4 | Exposed | A | A | A | A |
|  | Not exposed | B | B | B | B |

Testing Methods

1. Wet Smear Resistance

The printed characters were rubbed with wet tissue paper and bleeding was evaluated on the basis of the following standards:

A: No bleeding was seen.

B: Contamination was found at the periphery of the rubbed section.

C: Significant contamination was found at the periphery.

2. Dry Smear Resistance

The printed characters were rubbed with an eraser and were evaluated on the basis of the following standards:

A: Density of the characters did not change.

B: Density decreased and the eraser was contaminated.

C: Density noticeably decreased.

3. Water Resistance

Water droplets were dropped on the printed paper, the paper was tilted, and blurring was evaluated on the basis of the following standards:

A: No blurring of the unprinted section was found.

B: Blurring was found at the periphery of the section where water wad dropped.

C: The characters became unclear and the unprinted section was contaminated.

4. Marker Pen Resistance

The printed characters were overwritten two times with a yellow marker and evaluated on the basis of the following standards:

A: Blurring was not found at a position overwritten later and the marker was not contaminated.

B: Blurring was found at positions overwritten later and the marker was contaminated.

C: Significant blurring was found at positions overwritten later and the marker was significantly contaminated.

Example 3

An ink set including anionic dye color inks was prepared according to the formulations shown in Table 8 to 10.

TABLE 8

Magenta Ink (M-5)

| Ingredient | Content (parts by weight) |
|---|---|
| Magenta dye *1 | 3.5 |
| Nonionic oligomer 3 | 10 |
| Photopolymerization initiator 3 | 0.5 |

TABLE 8-continued

Magenta Ink (M-5)

| Ingredient | Content (parts by weight) |
|---|---|
| 12-mole ethylene oxide adduct of glycerin | 5 |
| Thiodiglycol | 2 |
| Water | 79 |

Note *1:
The magenta dye has the following structure:

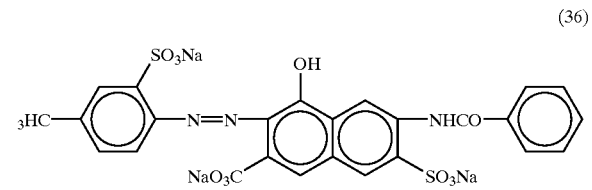

(36)

TABLE 9

Cyan Ink (C-5)

| Ingredient | Content (parts by weight) |
|---|---|
| Direct Blue 199 (made by Zeneca Inc.) | 5 |
| Nonionic oligomer 3 | 10 |
| Photopolymerization initiator 3 | 0.5 |
| 12-mole ethylene oxide adduct of glycerin | 10 |
| Thiodiglycol | 5 |
| Water | 69.5 |

TABLE 10

Yellow Ink (Y-5)

| Ingredient | Content (parts by weight) |
|---|---|
| Direct Yellow 132 (made by Daiwa Dyestuff Mfg. Co., Ltd.) | 5 |
| Nonionic oligomer 3 | 10 |
| Photopolymerization initiator 3 | 0.5 |
| 12-mole ethylene oxide adduct of glycerin | 10 |
| Thiodiglycol | 5 |
| Water | 69.5 |

Example 4

Using the color inks prepared in EXAMPLE 3 and the black ink BK-1 prepared in EXAMPLE 1, images were recorded on various types of paper, that is, plain paper NSK for electrophotographic copy made by Canon Kabushiki Kaisha, Neusiedler paper, Paper 4024 made by Fuji Xerox Co., Ltd., and Gilbert Bond paper, by a bubble-jet printer BJC-430 (made by Canon Kabushiki Kaisha) provided with an ultraviolet lamp, as in EXAMPLE 2. An image including black characters and solid color patterns was printed and exposed to ultraviolet light. The printed black letters were clear without bleeding into the solid color patterns. The prints were evaluated as follows. The results are shown in Table 11, with the water resistance results for prints not exposed to ultraviolet light for comparison. The smear resistance was evaluated as in EXAMPLE 2.

Testing Methods
5. Water Resistance

Each recording paper was immersed in tap water for one minute. The residual rate of the optical density (OD) with respect to untested paper was calculated, wherein the residual rate is represented by the following equation:

{(optical density of print immersed in water for 1 minute)/(initial optical density)}×100

A: The residual rate was in the range of 80% to 120%.
B: The residual rate was in the range of 50% to 80%.
C: The residual rate was in the range of 30% to 50%.

6. Discoloration Rate

The discoloration rate was determined by the following equation:

Discoloration rate=(reflection density of a sample exposed to UV light/reflection density of a sample not exposed to UV light)×100

TABLE 11

| Ink | Smear Resistance | | | | Water Resistance | | Discoloration Rate |
| | UV exposed | | UV unexposed | | UV | | |
| | Wet | Dry | Wet | Dry | UV exposed | UV unexposed | |
| --- | --- | --- | --- | --- | --- | --- | --- |
| Black BK-1 | A | A | B | B | A | B | 100 |
| Magenta M-5 | A | A | B | B | A | C | 86 |
| Cyan C-5 | A | A | B | B | A | C | 98 |
| Yellow Y-5 | A | A | B | B | A | C | 82 |

Note:
The results in Table 11 indicate an average for the four types of paper.

Example 5

An aqueous black ink BK-3 was prepared according to the formulation shown in Table 12. This ink does not contain a water-soluble organic solvent. The ink was loaded in an ink-jet printer and was used for printing tests. Problems such as unsatisfactory discharge did not occur during continuous printing or during secondary printing after a pause, probably due to the function of the oligomer as a humectant.

TABLE 12

Black Ink (BK-3)

| Ingredient | Content (parts by weight) |
| --- | --- |
| IJX-55 (Cationic carbon black made by Cabot Corp.) | 5 |
| Cationic oligomer 4 | 20 |
| Photopolymerization initiator 3 | 2 |
| Water | 73 |

Example 6

An aqueous anionic black ink BK-5 was prepared according to the formulation shown in Table 13. Using an ink set of a black ink BK-1, a magenta ink M-5, a cyan ink C-5, and a yellow ink Y-5, an image including black characters on color solid background patterns was formed, as in EXAMPLE 2. Furthermore, using an ink set of a black ink BK-5, a magenta ink M-5, a cyan ink C-5, and a yellow ink Y-5, an image including black characters on color solid background patterns were formed, as in EXAMPLE 2. Bleeding between the black characters and solid color patterns of these images were visually evaluated. The results are shown in Table 14.

TABLE 13

Black Ink (BK-5)

| Ingredient | Content (parts by weight) |
| --- | --- |
| Anionic carbon black dispersion having a solid content of 15.3% by weight (Cabojet 300 made by Cabot Corp.) | 25 |
| Nonionic oligomer 4 | 10 |
| Photopolymerization initiator 3 | 1 |
| Diethylene glycol | 15 |
| Water | 49 |

TABLE 14

| Ink Combination | | Crispness of Black Characters | Bleeding of Black Ink to Color Portions |
| Black | Color | | |
| --- | --- | --- | --- |
| BK-1 (Cationic) | M-5, C-5, Y-5 | Crisp | None |
| BK-5 (Anionic) | M-5, C-5, Y-5 | Not crisp (thick characters) | Whisker bleeding |

As shown in Table 14, a combination of a black ink and a set of color inks having a polarity opposite to that of the black ink can satisfactorily prevent bleeding on plain paper.

As described above, a pigment dispersion aqueous black ink in accordance with the present invention can totally overcome problems in conventional pigment dispersion aqueous black inks. In particular, this aqueous black ink has high image density, high water and light resistance, satisfactory initial penetration and fixing characteristics, and high adhesiveness to recording media. Furthermore, an ink-jet recording method can prevent bleeding between the black ink and color inks.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A photopolymerization initiator represented by the following general formula (1):

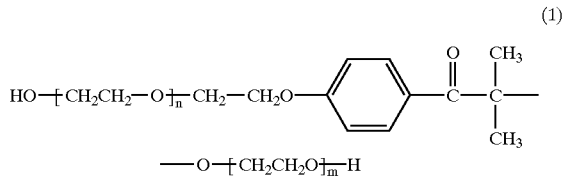

wherein n is an integer of 1 or more, m is an integer of 1 or more, and the sum of n and m is in a range of 2 to 8.

2. A photopolymerization process comprising the step of:

irradiating a photopolymerization initiator according to claim 1 and a polymerizable oligomer.

3. A photopolymerization process according to claim 2, wherein the photopolymerization initiator and the polymerizable oligomer are dissolved in solvent.

4. A photopolymerization process according to claim 2, wherein the photopolymerization initiator and the polymerizable oligomer are dissolved in water.

* * * * *

UNITED STATES PATENT AND TRADEMARK OFFICE
CERTIFICATE OF CORRECTION

PATENT NO.    : 6,500,875 B2
DATED         : December 31, 2002
INVENTOR(S)   : Hiromichi Noguchi It is certified that error appears in the above-identified patent and that said Letters Patent is hereby corrected as shown below:

Column 1,
Line 19, "pigment such," should read -- pigment, such --.

Column 4,
Line 43, "dolor" should read -- color --.

Column 15,
Line 56,

"
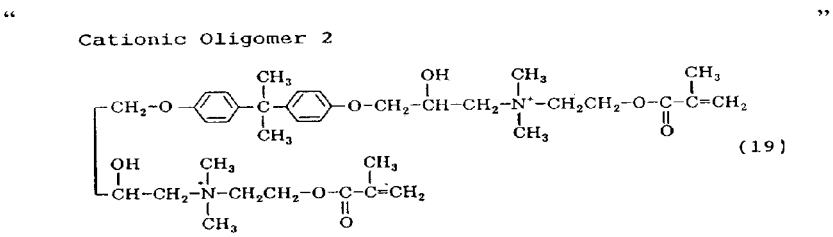
"

should read

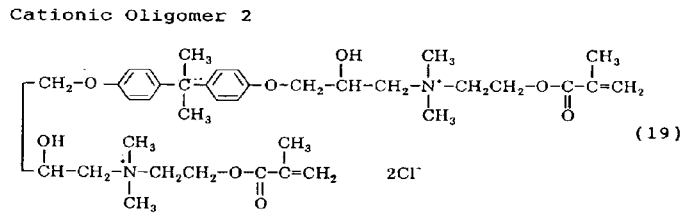

Column 17,
Line 54,

"
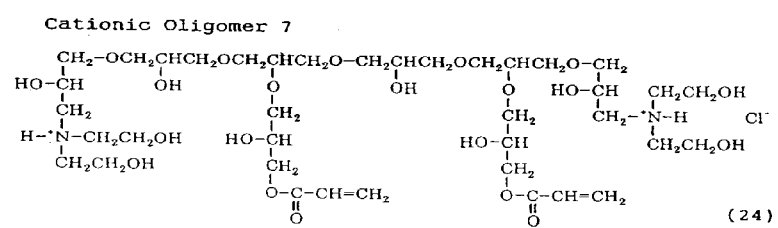
"

should read

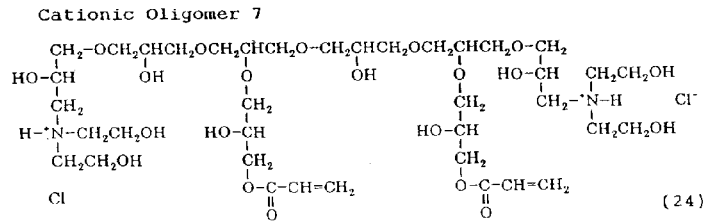

UNITED STATES PATENT AND TRADEMARK OFFICE
CERTIFICATE OF CORRECTION

PATENT NO. : 6,500,875 B2
DATED : December 31, 2002
INVENTOR(S) : Hiromichi Noguchi It is certified that error appears in the above-identified patent and that said Letters Patent is hereby corrected as shown below:

Column 26,
Line 14, "are-earth" should read -- a rare-earth --.
Line 15, "used" should read -- used, --.
Line 29, "ps" should be deleted, and "Ink-Jet Recording Apparatus" should begin a new line.

Column 31,
Line 40, "wad" should read -- was --.

Signed and Sealed this

Seventeenth Day of February, 2004

JON W. DUDAS
*Acting Director of the United States Patent and Trademark Office*